United States Patent
Kanaya

(10) Patent No.: US 10,845,905 B2
(45) Date of Patent: Nov. 24, 2020

(54) DISPLAY DEVICE

(71) Applicant: Japan Display Inc., Tokyo (JP)

(72) Inventor: Heisuke Kanaya, Tokyo (JP)

(73) Assignee: Japan Display Inc., Tokyo (JP)

( * ) Notice: Subject to any disclaimer, the term of this patent is extended or adjusted under 35 U.S.C. 154(b) by 53 days.

(21) Appl. No.: 16/242,110

(22) Filed: Jan. 8, 2019

(65) Prior Publication Data

US 2019/0220123 A1 Jul. 18, 2019

(30) Foreign Application Priority Data

Jan. 12, 2018 (JP) ................................. 2018-003447

(51) Int. Cl.
*G09G 5/00* (2006.01)
*G06F 3/041* (2006.01)
(Continued)

(52) U.S. Cl.
CPC .......... *G06F 3/0412* (2013.01); *G06F 1/1698* (2013.01); *G06F 3/047* (2013.01);
(Continued)

(58) Field of Classification Search
CPC ................... G06F 3/044; G06F 3/0418; G06F 2203/04105; G06F 2203/04103; G06F 2203/04111; G06F 3/0412; G06F 1/1698; G06F 3/0445; H01L 27/323; H01L 51/5253; H01L 51/524; H01L 27/124; H01L 27/1259
(Continued)

(56) References Cited

U.S. PATENT DOCUMENTS

2010/0013745 A1 1/2010 Kim et al.
2012/0133597 A1* 5/2012 Chen .................... H01Q 1/2225
345/173

(Continued)

FOREIGN PATENT DOCUMENTS

JP 2004-120055 A 4/2004
JP 2016-184277 A 10/2016
(Continued)

OTHER PUBLICATIONS

Korean Office Action dated Apr. 2, 2020 for the corresponding Korean Patent Application No. 10-2018-0156755, with partial English machine translation retrieved from EPO Global Dossier.

*Primary Examiner* — Jennifer T Nguyen
(74) *Attorney, Agent, or Firm* — Michael Best & Friedrich LLP

(57) ABSTRACT

A display device in an embodiment according to the present invention includes a base member, a display part with a plurality of pixels above the base member, a touch sensor overlapping the display part, an antenna in a periphery part of the display part, and a terminal part including a plurality of terminal electrodes on an outer side of the antenna. The touch sensor includes a first sensor electrode arranged on a first surface side of a first insulating layer and having a plurality of first electrode patterns arranged in a first direction, and a second sensor electrode arranged on the first surface side of the first insulating layer and having a plurality of second electrode patterns arranged in a second direction intersecting the first direction.

20 Claims, 21 Drawing Sheets

(51) Int. Cl.
  *G06F 3/047* (2006.01)
  *H01L 27/32* (2006.01)
  *G06F 1/16* (2006.01)
  *G06F 3/044* (2006.01)

(52) U.S. Cl.
  CPC ........ *G06F 3/0443* (2019.05); *G06F 3/04164* (2019.05); *H01L 27/323* (2013.01); *G06F 2203/04103* (2013.01); *G06F 2203/04111* (2013.01); *G06F 2203/04112* (2013.01)

(58) Field of Classification Search
  USPC ........................................ 345/173, 174, 204
  See application file for complete search history.

(56) References Cited

U.S. PATENT DOCUMENTS

| | | | |
|---|---|---|---|
| 2014/0160072 A1* | 6/2014 | Inagaki ................. | G06F 3/0418 345/174 |
| 2015/0185928 A1 | 7/2015 | Son et al. | |
| 2016/0241306 A1* | 8/2016 | Moon ..................... | H01Q 7/00 |
| 2018/0059845 A1* | 3/2018 | Tada ....................... | G06F 3/041 |
| 2018/0059869 A1* | 3/2018 | Ma .......................... | G06F 3/044 |
| 2019/0346987 A1* | 11/2019 | Shi ......................... | H01L 27/1259 |

FOREIGN PATENT DOCUMENTS

| | | |
|---|---|---|
| KR | 10-2016-0029468 A | 3/2016 |
| KR | 10-2017-0088814 A | 8/2017 |

\* cited by examiner

DISPLAY DEVICE

CROSS REFERENCE TO RELATED APPLICATIONS

This application is based upon and claims the benefit of priority from the prior Japanese Patent Application No. 2018-003447, filed on Jan. 12, 2018, the entire contents of which are incorporated herein by reference.

FIELD

One embodiment of the present invention is related to a display device. One embodiment of the present invention is related to a display device including an antenna compatible with near field communication.

BACKGROUND

Models compatible with near field communication (NFC) have been increasing in a mobile information terminal device exemplified by a multifunctional mobile phone called a smartphone which performs operations by touching an image such as an icon displayed on a mobile phone or a screen. NFC is a standard capable of wireless communication within a range of about 100 mm, and it is expected that the number of models installed in mobile information terminal devices in order to provide credit and other payment functions will increase.

To be compatible with NFC, it is necessary to arrange an antenna in a mobile information terminal device. For example, a structure is disclosed in which a dipole antenna and a microstrip line connected to the antenna are arranged in the outer periphery of a touch panel (see Japanese Laid Open Patent Application Publication No. 2016-184277).

SUMMARY

A display device in an embodiment according to the present invention includes a base member, a display part with a plurality of pixels above the base member, a touch sensor overlapping the display part, an antenna in a periphery part of the display part, and a terminal part including a plurality of terminal electrodes on an outer side of the antenna. The touch sensor includes a first sensor electrode arranged on a first surface side of a first insulating layer and having a plurality of first electrode patterns arranged in a first direction, and a second sensor electrode arranged on the first surface side of the first insulating layer and having a plurality of second electrode patterns arranged in a second direction intersecting the first direction. The plurality of first electrode patterns of the first sensor electrode are electrically connected at the first surface side of the first insulating layer, the plurality of second electrode patterns of the second sensor electrode are electrically connected by connection wiring arranged on a second surface side opposite to the first surface side of the first insulating layer, the first sensor electrode is electrically connected to at least one of the plurality of terminal electrodes by a first wiring arranged on the second surface side of the first insulating layer in an outer region of the display part, the second sensor electrode is electrically connected to at least one of the plurality of terminal electrodes by a second wiring arranged on the second surface side of the first insulating layer in an outer region of the display part, and the antenna is arranged on the first surface side of the first insulating layer and surrounding the display part and at least overlaps a part of the first wiring and a part of the second wiring interposed by the first insulating layer.

A display device in an embodiment according to the present invention includes a base member, a display part with a plurality of pixels above the base member, a touch sensor overlapping the display part, an antenna in a periphery part of the display part, and a terminal part including a plurality of terminal electrodes on an outer side of the antenna. The touch sensor includes a first sensor electrode arranged on a first surface side of a first insulating layer and having a plurality of first electrode patterns arranged in a first direction, and a second sensor electrode arranged on the first surface side of the first insulating layer and having a plurality of second electrode patterns arranged in a second direction intersecting the first direction. The plurality of first electrode patterns of the first sensor electrode are electrically connected at the first surface side of the first insulating layer, the plurality of second electrode patterns of the second sensor electrode are electrically connected by connection wiring arranged on a second surface side opposite to the first surface side of the first insulating layer, the first sensor electrode is electrically connected to at least one of the plurality of terminal electrodes by a first wiring arranged on the first surface side of the first insulating layer, the second sensor electrode is electrically connected to at least one of the plurality of terminal electrodes by a second wiring arranged on the first surface side of the first insulating layer in an outer region of the display part, and the antenna is arranged on the second surface side of the first insulating layer and surrounding the display part and at least overlaps a part of the first wiring and a part of the second wiring interposed by the first insulating layer.

A display device in an embodiment according to the present invention includes a display part with a plurality of pixels, a touch sensor overlapping the display part and including a first sensor electrode arranged in a first direction and a second sensor electrode arranged in a second direction intersecting the first direction, an antenna in a periphery part of the display part, a terminal part including a first terminal electrode and a second terminal electrode arranged on an outer side of the antenna, and a first wiring electrically connecting the first sensor electrode and the first terminal electrode, and a second wiring electrically connecting the second sensor electrode and the second terminal electrode. The first sensor electrode and the second sensor electrode, and the first wiring and the second wiring are arranged interposed by an insulating layer, and the first wiring and the second wiring intersect the antenna via the insulating layer.

DESCRIPTION OF EMBODIMENTS

Hereinafter, the embodiments of the present invention will be described while referencing the drawings. However, the present invention may be implemented in many different ways, therefore interpretation should not be limited to the content exemplified in the embodiments below. In order to provide a clearer description, some components of the drawings such as the width, thickness, shape, etc. of each part are represented schematically. These drawings are merely examples and do not limit the interpretation of the present invention. In this specification and each of the drawings, elements similar to previously described elements are marked with the same symbols (numbers followed by a, b, and the like) and detailed descriptions are omitted accordingly. Furthermore, characters labeled as "first" and "second" are symbols used to distinguish each element, and do not have any further meaning unless otherwise specified.

In this specification, when certain components or regions are described as being "above" or "below" other components or regions, as long as there are no limitations, it does not necessarily mean they are directly above or below. This description includes cases in which a component or region is located higher or lower than another component or region. In other words, other components or regions are located between the component or region being described and the component or region above or below. Further, in the description below, unless otherwise noted, in a sectional view, the side on which the second substrate is located with respect to the substrate will be described as "above" and the other side will be described as "below".

First Embodiment

Figure 1:
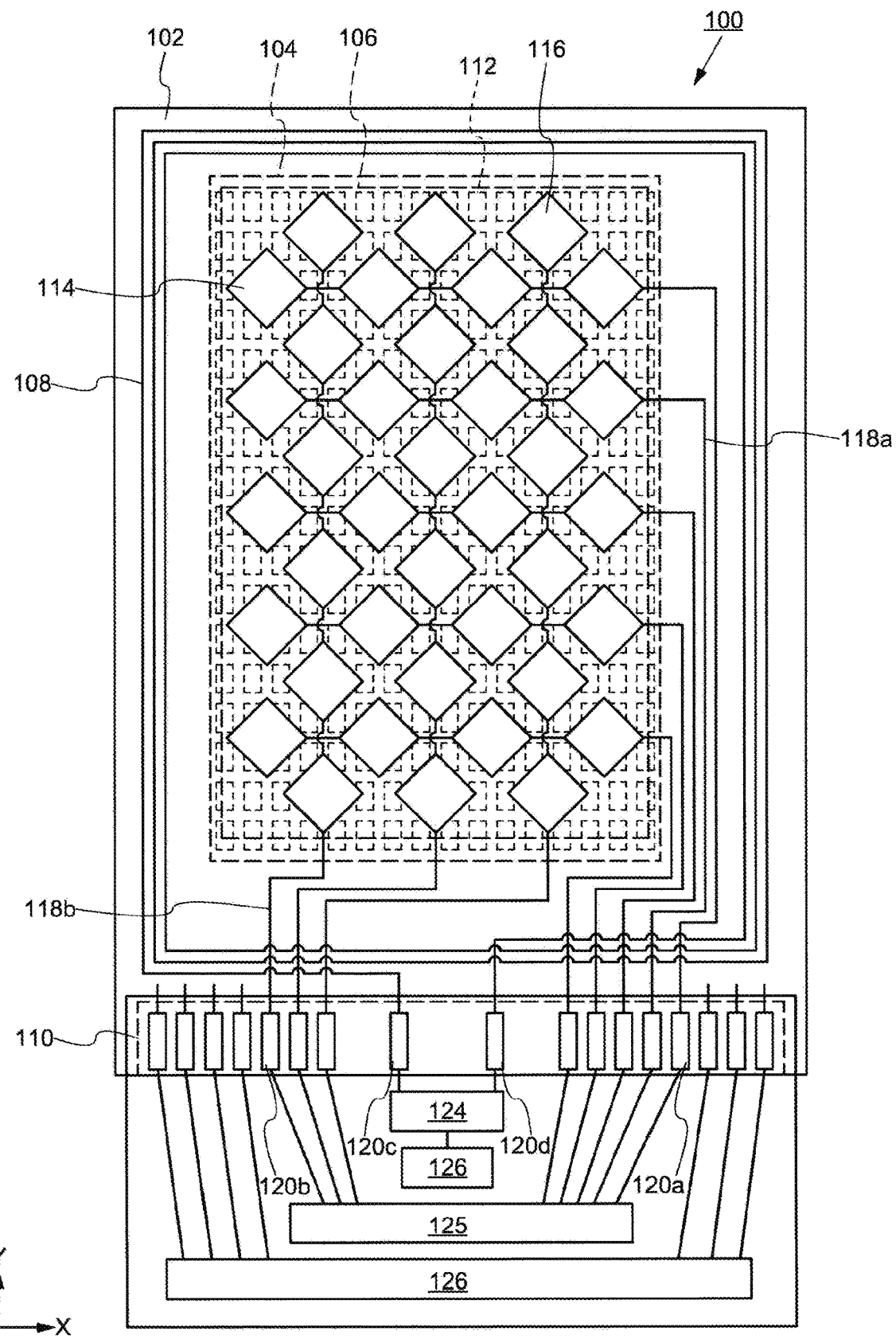
FIG. 1 is a diagram showing a structure of a display device related to one embodiment of the present invention.

FIG. 1 shows a structure of a display device 100 according to one embodiment of the present invention. The display device 100 shown in FIG. 1 includes a display part 104, a touch sensor 106, an antenna 108 and a terminal part 110 arranged on a base member 102. A plurality of pixels 112 are arranged in the display part 104. The touch sensor 106 includes a first sensor electrode 114 and a second sensor electrode 116, and is arranged overlapping the display part 104. The antenna 108 is arranged in an outer side region of the display part 104 and the touch sensor 106. The terminal part 110 includes a plurality of terminal electrodes 120 and is arranged at an end part of the base member 102.

The base member 102 is formed from a glass substrate, a plastic substrate or a film shaped member formed from an organic resin material. The film shaped member has flexibility. For example, it is possible to use a polyimide film coated on a support substrate as one type of film shaped member. The polyimide film has flexibility and can be formed to a thickness of about 5 μm to 50 μm, for example, about 10 μm. It is also possible to use a glass substrate having a thickness of about 100 μm to 200 μm as another member forming the base member 102. In this case, it is preferred to use a bonded organic resin film for improving impact resistance. By using this type of base member 102 having flexibility, it is possible to realize a display device 100 having flexibility.

The display part 104 is arranged with a plurality of pixels 112. A pixel 112 includes a display element and a transistor for controlling the display element. A light emitting element or an electrooptic element and the like is applied as the display element. An organic electroluminescent element including an organic electroluminescent material in a light emitting layer can be used as the light emitting element. A liquid crystal element which utilizes an electrooptic effect (change in orientation of liquid crystal molecules by applying an electric field) of liquid crystals can be used as the electrooptic element. A thin film transistor in which a channel is formed in a semiconductor thin film can be used as the transistor. Although not shown in FIG. 1, a scanning signal line driving circuit which outputs a scanning signal or a data signal line driving circuit which outputs a data signal and the like may be arranged on the base member 102 adjacent to the display part 104.

The touch sensor 106 includes the first sensor electrode 114 which extends in a first direction (for example, the X direction shown in FIG. 1) and the second sensor electrode 116 which extends in a second direction (for example, the Y direction shown in FIG. 1) intersecting the first direction. A plurality of first sensor electrodes 114 are arranged substantially parallel in the second direction. A plurality of second sensor electrodes 116 are arranged substantially parallel in the first direction.

The antenna 108 is formed by a conductive film formed in a linear shape. The antenna 108 which is formed in a linear shaped conductive film has a loop antenna (or "antenna coil") form arranged to surround the periphery of the display part 104. The antenna 108 may be a loop antenna with one turn or may be a multiple loop antenna with multiple turns as is shown in FIG. 1.

The terminal part 110 includes a plurality of terminal electrodes 120. A first terminal electrode 120a among the plurality of terminal electrodes 120 is electrically connected to the first sensor electrode 114 by a first wiring 118a. A second terminal electrode 120b is electrically connected to the second sensor electrode 116 by a second wiring. In addition, a third terminal electrode 120c is electrically connected to a first end side of the antenna 108. A fourth terminal electrode 120d is electrically connected to a second end side of the antenna 108. In addition, although not shown in detail in FIG. 1, wiring which connects the scanning signal line driving circuit and the data signal line driving circuit, and the terminal part is also connected to each of the plurality of terminal electrodes 120 respectively.

The terminal part 110 is electrically connected to a flexible wiring substrate 122. FIG. 1 shows a form in which the third terminal electrode 120c and the fourth terminal electrode 120d which are connected to the antenna 108 are connected to the flexible wiring substrate 122. The flexible wiring substrate 122 may be mounted with an integrated circuit 126 which performs input and output of signals via the resonance capacitor 124 and the antenna 108 by chip on film (COF). The flexible wiring substrate 122 may be mounted with a touch sensor control IC 125 for inputting and outputting a signal to the touch sensor 106, and a display control driver IC 127 for driving a pixel 112. The integrated circuit 126, the touch sensor control IC 125 and the display control driver IC 127 may be realized by one IC chip (semiconductor device).

The antenna 108 is arranged on the base member 102 in the display device 100 shown in FIG. 1. The antenna 108 can be used for near field communication. The display device 100 in which the antenna 108 is integrated can be applied to an information terminal device including a near field communication (NFC) function. For example, the display device 100 can be applied to mobile phones, multifunctional mobile phones called smart phones and tablet type computers or the like.

Figure 2:
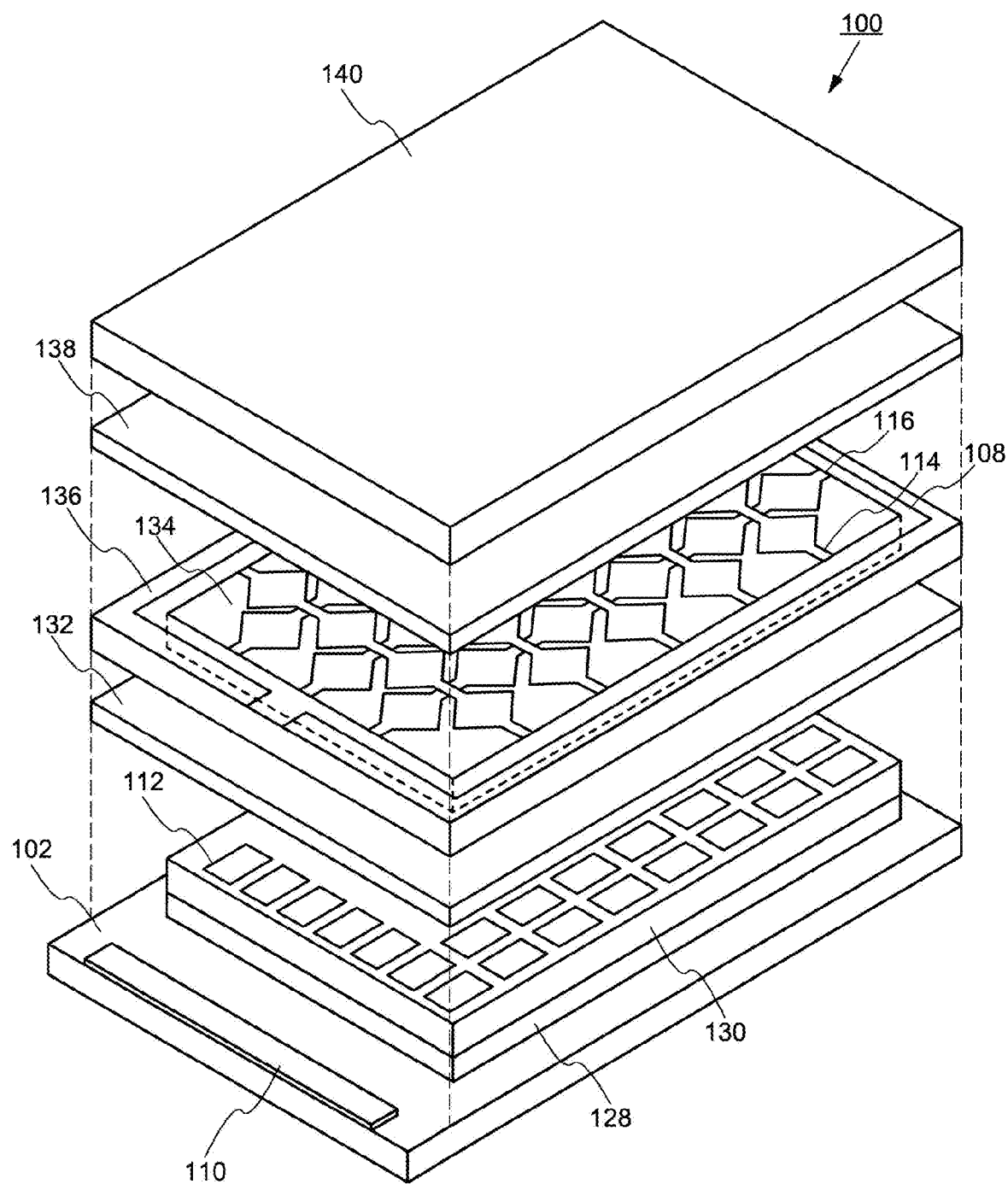
FIG. 2 is a perspective diagram schematically showing a stacked layer structure of a display device related to one embodiment of the present invention.

FIG. 2 is a perspective diagram showing a schematic stacked structure of the display device 100. A driving element layer 128 and a display element layer 130 are stacked on a first surface of the base member 102. The driving element layer 128 includes a transistor and includes a circuit for driving a pixel 112. The display element layer 130 includes the display element. A sealing layer 132 is arranged above the display element layer 130. The display element layer 130 is sealed by the sealing layer 132.

The touch sensor layer 134 is arranged above the sealing layer 132. The touch sensor layer 134 includes the first sensor electrode 114 and the second sensor electrode 116. The antenna layer 136 includes the antenna 108 and is arranged to surround the touch sensor layer 134. The touch sensor layer 134 and the antenna layer 136 include a common insulating layer. That is, the touch sensor layer 134 and the antenna layer 136 include at least one insulating layer which is continuous between them. Furthermore, a conductive layer which forms the first sensor electrode 114 and the second sensor electrode 116 in the touch sensor layer 134 and a conductive layer which forms the antenna 108 in the antenna layer 136 contact with the same insulating layer. A polarization plate 138 and a cover glass 140 may be arranged above the touch sensor layer 134 and the antenna layer 136.

The display device 100 according to the present embodiment includes the touch sensor layer 134 and the antenna layer 136 which have the same layer structure. In other words, the touch sensor layer 134 and the antenna layer 136 are arranged side by side which do not overlap each other. By adopting such a structure, it is possible to build the antenna 108 for use in near field communication (NFC) in the display device 100 without adding a new layer.

Figure 3:
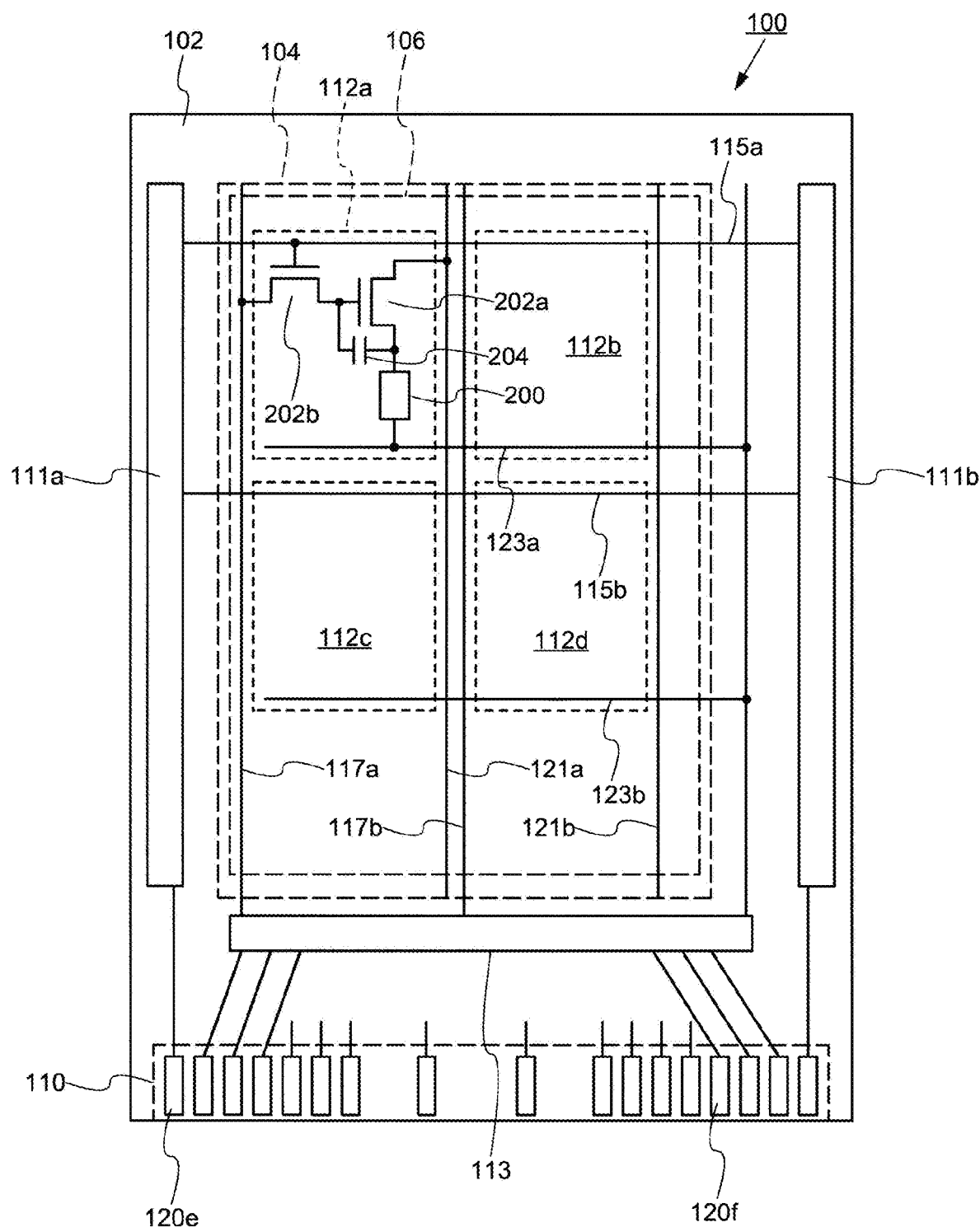
FIG. 3 is a diagram showing a structure of a display device related to one embodiment of the present invention.

FIG. 3 shows a structure of the display part 104 (structure excluding the touch sensor 106 and the antenna 108) of the display device 100 according to one embodiment of the present invention. The display part 104 includes a pixel 112. FIG. 3 shows a form in which four pixels 112a, 112b, 112c and 112d are arranged. In addition, gate signal lines 115a and 115b, data signal lines 117a and 117b, power supply lines 121a and 121b, and common wirings 123a and 123b are arranged corresponding to the arrangement of the pixels 112 in the display part 104. The pixel 112 a includes a light emitting element 200, a driving transistor 202a which is connected to the light emitting element 200, a capacitor element 204 which is connected to the driving transistor 202a, and a selection transistor 202b which is connected between the gate of the driving transistor 202a and the data signal line 117a. Although omitted from FIG. 3, the other pixels 112b, 112c and 112d are also the same. The gate of the selection transistor 202b is connected to a scanning signal line 115a, and ON/OFF is controlled by a scanning signal. The driving transistor 202a and the light emitting element 200 are connected in series between the power supply line 121a and the common wiring 123a. Furthermore, the circuit of the pixel 112 which is shown in FIG. 3 is an example and the pixel 112 is not limited to this type of a circuit structure, and may also have another circuit structure.

Although FIG. 3 shows a form in which four pixels 112a, 112b, 112c, and 112d are arranged on the display part 104, the number of pixels 112 may be arbitrary, and a plurality of pixels 112 may be arranged in a row direction and a column direction. The arrangement of the pixels 112 is arbitrary, and various arrangements such as a stripe arrangement, a Bayer arrangement, a delta arrangement, and a pentile arrangement can be applied. The display part 104 which has this type of structure is arranged to overlap the touch sensor 106.

Scanning signal line driving circuits 111a and 111b which output scanning signals to a scanning signal line 115 and a selector circuit 113 which selects a data signal line 117 are arranged on the outer side of the display part 104. The selector circuit 113 has a function for assigning a data signal output from the display control driver IC 127 to each data signal line 117. Furthermore, FIG. 3 exemplarily shows a form in which the scanning signal line driving circuit 111a is electrically connected to a terminal electrode 120e and the selector circuit 113 is electrically connected to a terminal electrode 120f.

Figure 4:
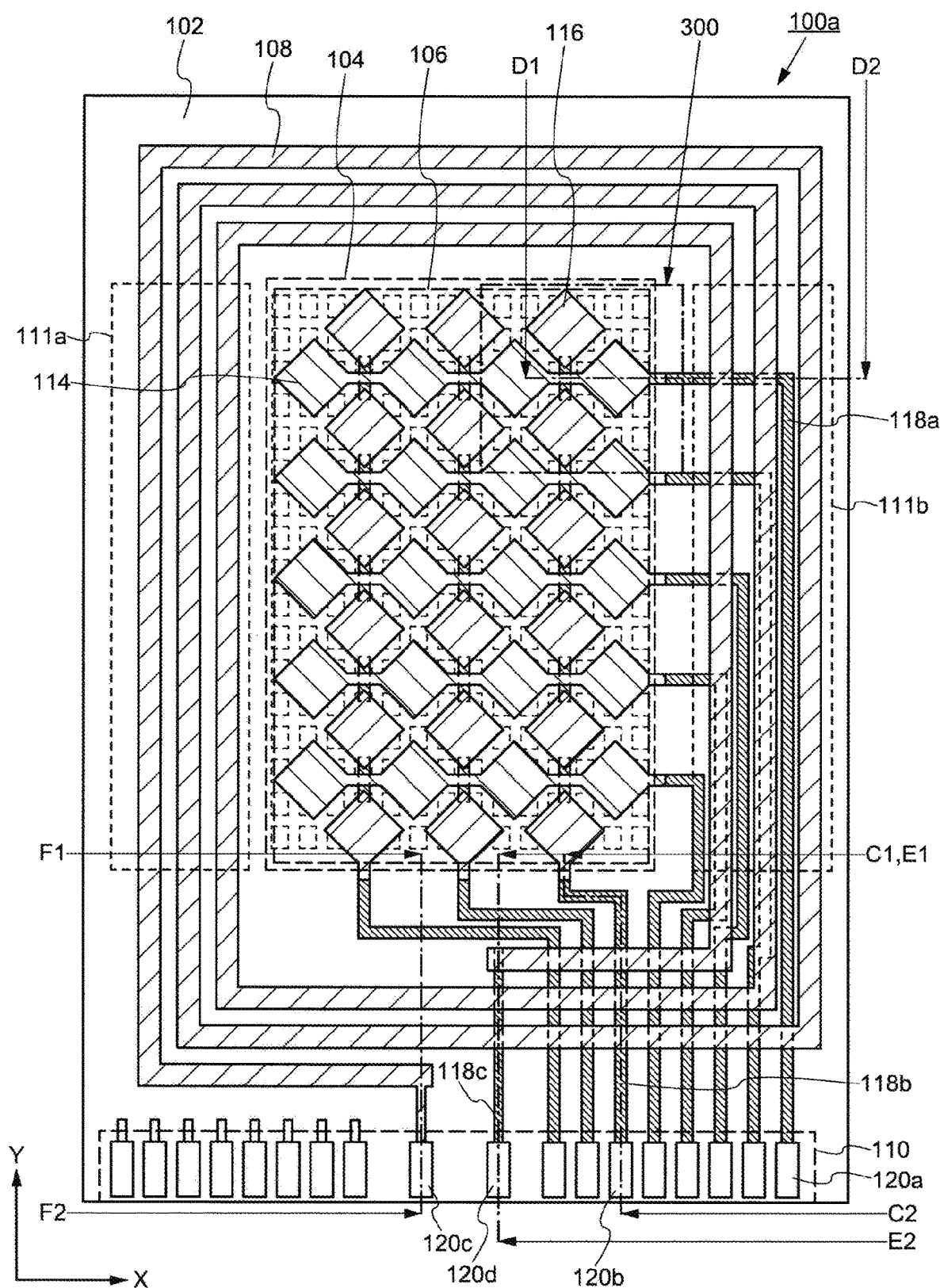
FIG. 4 is a diagram showing a structure of a display device related to one embodiment of the present invention.

FIG. 4 shows a structure of the touch sensor 106 and the antenna 108 of the display device 100a. The touch sensor 106 includes the first sensor electrode 114 extending a first direction (the X direction shown in FIG. 4 for example), and the second sensor electrode 116 extending in a second direction intersecting the first direction (the Y direction shown in FIG. 4 for example). As is shown in FIG. 4, the touch sensor 106 is arranged with a plurality of first sensor electrodes 114 and a plurality of second sensor electrodes 116 intersecting each other.

The first sensor electrode 114 is electrically connected to the first wiring 118a. The first wiring 118a is extracted from an end part of the first sensor electrode 114 toward the periphery part of the base member 102. The first wiring 118a is further arranged along the periphery part of the base member 102 and is electrically connected to the first terminal electrode 120a. The second sensor electrode 116 is electrically connected to the second wiring 118b. The second wiring 118b is extracted from an end part of the second sensor electrode 116 toward the terminal part 110. The second wiring 118b is electrically connected to the second terminal electrode 120b. Furthermore, FIG. 4 shows a form in which the first wiring 118a and the second wiring 118b are arranged on a layer lower than the first sensor electrode 114 and the second sensor electrode 116 sandwiching an insulating layer.

The antenna 108 is arranged in a region on the outer side of the touch sensor 106. A conductive layer which forms the antenna 108 is formed in the same layer as the first sensor electrode 114 and the second sensor electrode 116. Therefore, the antenna 108 and the first sensor electrode 114 and the second sensor electrode 116 are arranged so that they do not overlap each other. On the other hand, the antenna 108 is arranged to overlap the scanning signal line driving circuits 111a and 111b via an insulating layer. By adopting this type of arrangement, it is possible to prevent enlargement of the periphery region (also called a frame region) due to the addition of the antenna 108. A first end of the antenna 108 extends to the terminal part 110 with the conductive layer which forms the loop antenna as it is, and is electrically connected to the third terminal electrode 120c. A second end of the antenna 108 is arranged on the inner side of the loop antenna which is wound a plurality of times. As a result, the second end of the antenna 108 is electrically connected to the third wiring 118c which is formed in the same layer as the first wiring 118a and the second wiring 118b. The third wiring 118c extends from the second end of the antenna 108 toward the terminal part 110 and is electrically connected to the fourth terminal electrode 120d.

In the structure shown in FIG. 4, the structure of the display device 100a can be simplified by forming the touch sensor 106 and the antenna 108 on the surface of the same insulating layer, and connected them to the terminal electrode 120 by the wiring 118 which is arranged sandwiching an insulating layer. In addition, it is possible to simplify the manufacturing process of the display device 100a.

In the present embodiment, the touch sensor 106 which is applied to the display device 100a is an electrostatic capacitance type sensor which detects the presence/absence of a touch from a change in electrostatic capacitance between the first sensor electrode 114 and the second sensor electrode 116. A self-capacitance type and a mutual capacitance type are known methods of a capacitive touch sensor. The touch sensor 106 according to the present embodiment can be applied to either the self-capacitance type or the mutual capacitance type. In the self-capacitance type, the electrostatic capacitance between a block pattern of a sensor electrode and the human body (fingertip) is detected, and a touch state is determined. In the mutual capacitance type, the sensor electrode is formed by a transmitter electrode (Tx electrode) and a receiver electrode (Rx electrode). In the mutual capacitance type, a pulse signal is provided to the transmitter electrode, and an electric field is formed between the transmitter electrode and the receiver electrode. Next, when a human body (fingertip) comes close to the sensing surface formed by the transmitter electrode and the receiver electrode, the electric field intensity decreases and the electrostatic capacitance changes. In the mutual capacitance type, a change in electrostatic capacitance is detected by a receiver electrode and the touch state is determined.

FIG. 4 shows a case where the touch sensor 106 is a mutual capacitance type sensor. In this case, it can be assumed that the first sensor electrode 114 is a transmitter electrode (Tx electrode) and the second sensor electrode 116 is a receiver electrode (Rx electrode). Naturally, the present invention it is not limited to this combination and the first sensor electrode 114 may be a receiver electrode (Rx electrode) and the second sensor electrode 116 may be a transmitter electrode (Tx electrode).

Figure 5A:
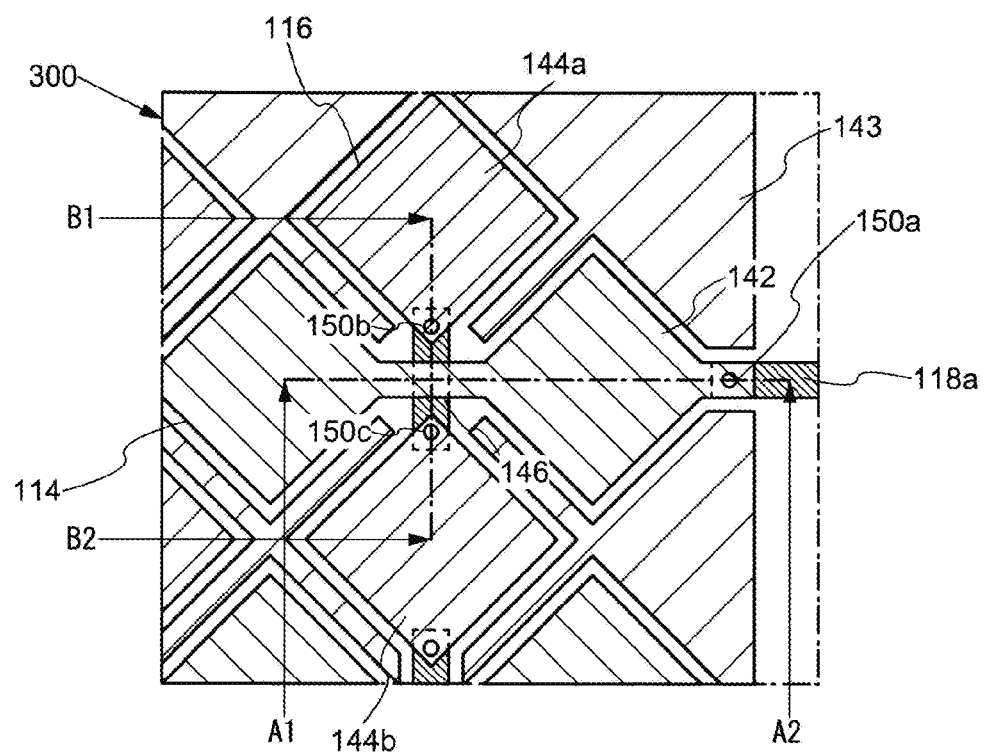
FIG. 5A shows an expanded diagram of the region 300 shown in FIG. 4.
Figure 5B:
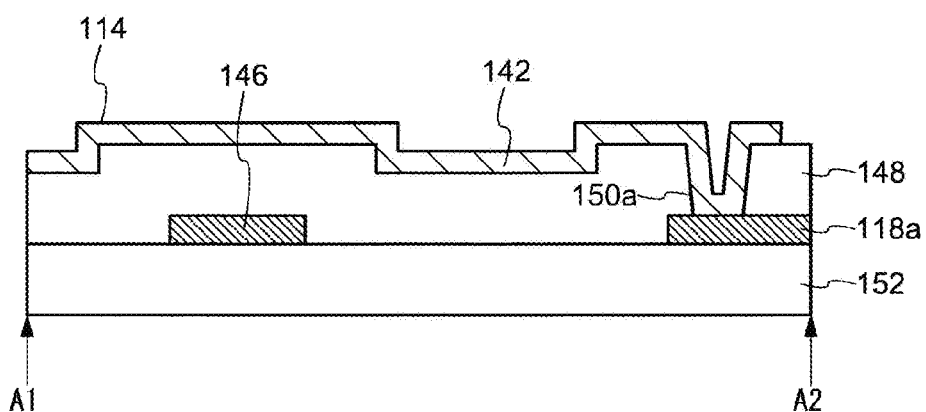
FIG. 5B shows a cross-sectional structure along the line A1-A2 shown in FIG. 5A.
Figure 5C:
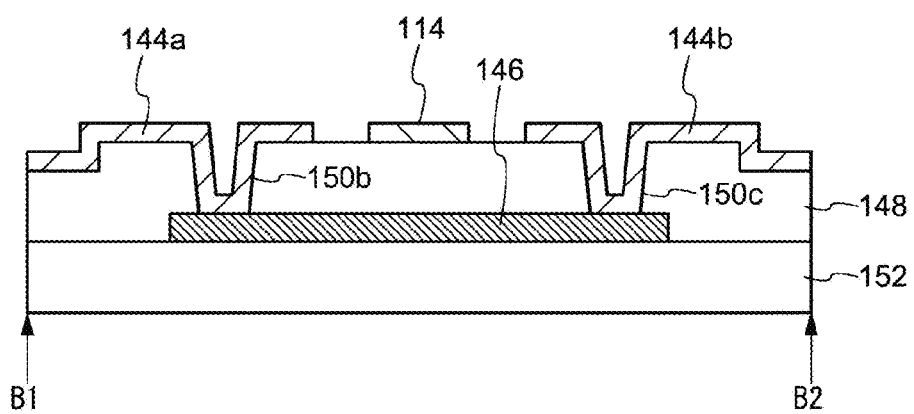
FIG. 5C shows a cross-sectional structure along the line B1-B2 shown in FIG. 5A.

FIG. 5A shows details of the first sensor electrode 114 and the second sensor electrode 116. FIG. 5A shows a planar diagram of the first sensor electrode 114 and the second sensor electrode 116, and shows a region corresponding to the region 300 surrounded by the dotted line in FIG. 4. FIG. 5B shows a cross-sectional structure corresponding to the line A1-A2 shown in FIG. 5A. In addition, FIG. 5C shows a cross-sectional structure corresponding to the line B1-B2 shown in FIG. 5A.

As is shown in FIG. 5A, the first sensor electrode 114 includes a plurality of first electrode patterns 142. Each of the plurality of first electrode patterns 142 is electrically connected to adjacent patterns by a conductive layer in the same layer as the first electrode pattern 142. That is, the first sensor electrode 114 is formed by linking a plurality of first electrode patterns 142. As is shown in FIG. 5B, the first sensor electrode 114 is formed by linking a plurality of first electrode patterns 142 arranged on the first surface side (upper surface side) of the first insulating layer 148. A second insulating layer 152 is arranged on the second surface side (lower surface side) of the first insulating layer 148 which is opposite to the first surface. The first wiring 118a is arranged between the first insulating layer 148 and the second insulating layer 152. One end of the first sensor electrode 114 is electrically connected to the first wiring 118a via a contact hole 150a which is arranged in the first insulating layer 148.

As is shown in FIG. 5A, the second sensor electrode 116 includes a plurality of second electrode patterns 144. FIG. 5A shows a second electrode pattern 144a and a second electrode pattern 144b. The second electrode pattern 144a and the second electrode pattern 144b are electrically connected by the connection wiring 146. That is, the second sensor electrode 116 is formed by linking the plurality of second electrode patterns 144 by the connection wiring 146. As is shown in FIG. 5C, the connection wiring 146 is arranged between the first insulating layer 148 and the second insulating layer 152. The connection wiring 146 has the same layer structure as the first wiring 118a and is formed from a conductive film which is formed in the same layer. The second electrode pattern 144a and the second electrode pattern 144b are electrically connected to the connection wiring 146 via a contact hole 150b and a contact hole 150c which are arranged in the first insulating layer 148. Furthermore, as is shown in FIG. 4, the second sensor electrode 116 is electrically connected to the second wiring 118b which is arranged between the first insulating layer 148 and the second insulating layer 152, the same as the first sensor electrode 114.

By arranging the first electrode pattern 142 and the second electrode pattern 144 on the first surface side (upper surface side) of the first insulating layer 148 and by arranging the connection wiring 146 on the second surface side (lower surface side) of the first insulating layer 148, It is possible to arrange the first sensor electrode 114 and the second sensor electrode 116 to intersect each other. In addition, by arranging the first wiring 118a on the second surface side (lower surface side) of the first insulating layer 148, it can be electrically connected to the terminal electrode 120. In this case, by forming the connection wiring 146 and the first wiring 118a from a conductive film which is formed in the same layer, it is possible to simplify the structure of the touch sensor 106 and prevent an increase in the number of manufacturing steps.

The shapes of the first electrode pattern 142 and the second electrode pattern 144 are arbitrary. FIG. 4 and FIG. 5A show a structure in which the outer shape of the first electrode pattern 142 and the second electrode pattern 144 is a diamond shape. However, the first electrode pattern 142 and the second electrode pattern 144 are not limited to a diamond shape and may be arbitrary polygonal shapes such as a triangle, a quadrangle or pentagon and the like, or they may be linear or circular. In addition, since it is sufficient that the first sensor electrode 114 and the second sensor electrode 116 have a resolution enough sufficient to identify a contact position of a part of the human body (for example, a fingertip) on the screen of the display unit 104, It is not necessary to be arranged as fine as a pixel. The sizes of the first electrode pattern 142 and the second electrode pattern 144 are sufficiently larger than the size of one pixel 112, and one electrode pattern overlaps at a size which overlaps a plurality of pixels 112.

The touch sensor 106 is arranged on the viewer side (the near side when seen from the observer) of the display unit 104. As a result, the first sensor electrode 114 and the second sensor electrode 116 having translucency is required. Alternatively, it is required that the first sensor electrode 114 and the second sensor electrode 116 are arranged so that they do not block the pixels 112. Due to this type of requirements, the first electrode pattern 142 and the second electrode pattern 144 are formed of a transparent conductive film such as by indium tin oxide (ITO). Since the first electrode pattern 142 and the second electrode pattern 144 are formed from a transparent conductive film, it is possible to arrange the first sensor electrode 114 and the second sensor electrode 116 to overlap a pixel 112.

The first sensor electrode 114 and the second sensor electrode 116 are arranged over substantially the entire display part 104. As a result, it is preferred that the first sensor electrode 114 and the second sensor electrode 116 have a low resistance from the viewpoint of preventing a delay in a detection signal of the presence/absence of a touch. In order to achieve low resistance, the first sensor electrode 114 and the second sensor electrode 116 are formed from a metal such as aluminum (Al), silver (Ag), titanium (Ti), molybdenum (Mo), nickel (Ni), chromium (Cr) and tantalum (Ta) or the like or an alloy containing these metals as a main component. However, the pixels 112 are covered when the first sensor electrode 114 and the second sensor electrode 116 are formed using a metal solid film. In order to solve such defects, it is required that the first electrode pattern 142, the second electrode pattern 144 and the connection wiring 146 have a structure which does not shield light output from the pixels 112.

Figure 6:
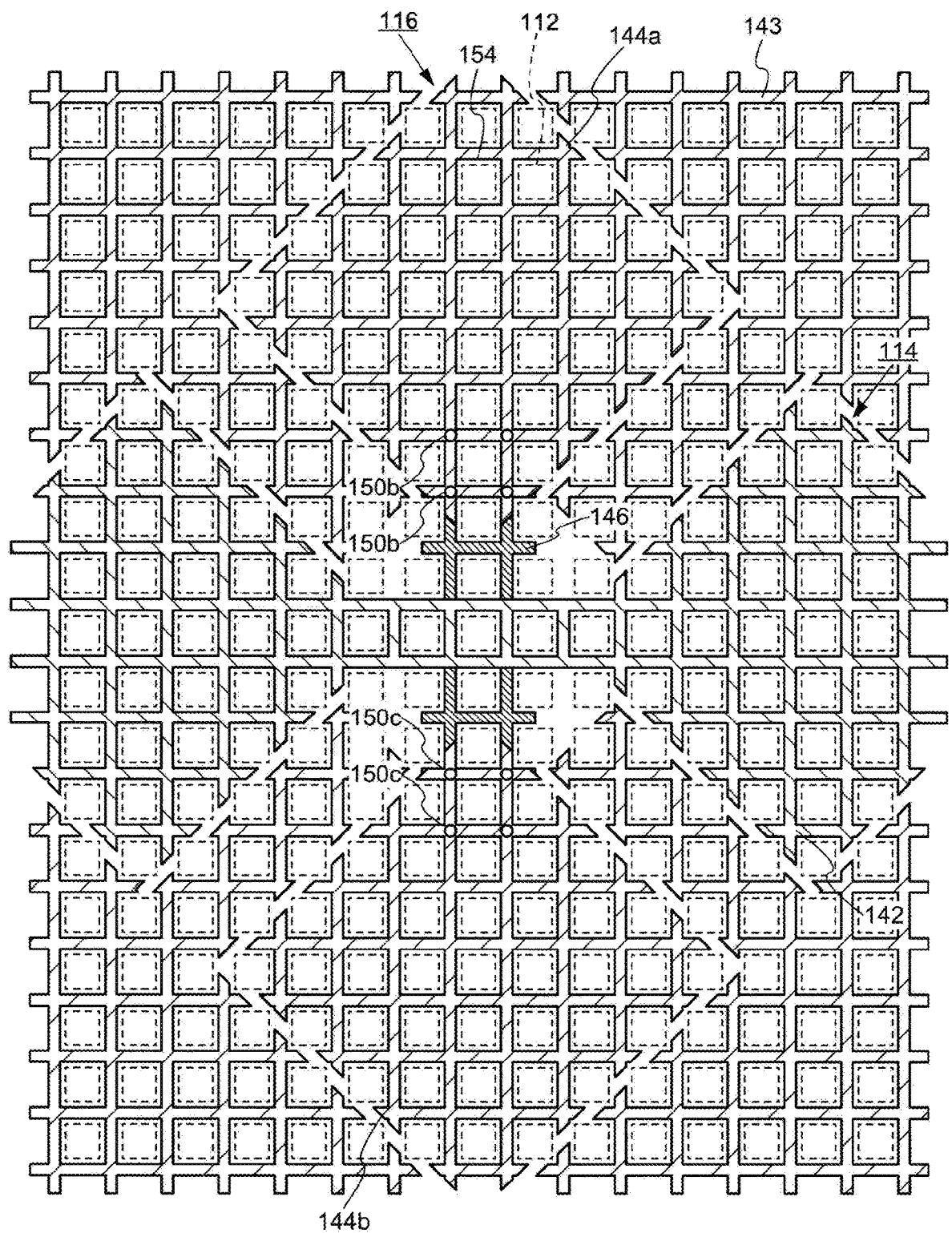
FIG. 6 is a planar diagram showing an electrode structure of a touch sensor included in a display device related to one embodiment of the present invention.

FIG. 6 shows one form of the first sensor electrode 114 and the second sensor electrode 116 which are formed using a metal material. FIG. 6 is a planar diagram of the first sensor electrode 114 and the second sensor electrode 116 and shows a form in which they are arranged overlapping a pixel 112.

FIG. 6 shows a form in which an opening part 154 is arranged in the first electrode pattern 142, the second electrode pattern 144, a dummy electrode pattern 143 and the connection wiring 146 which are formed from a metal material in alignment with the arrangement of the pixels 112. In other words, the first electrode pattern 142, the second electrode pattern 144 and the connection wiring 146 are mesh shaped and are arranged so that the mesh portion (opening part 154) of the mesh overlaps with a pixel 112. The first electrode pattern 142 and the second electrode pattern 144 have a rectangular (diamond) shape as a whole. In addition, similar to the structure shown in FIG. 5C, the second electrode pattern 144 and the connection wiring 146 are electrically connected to each other by the contact holes 150b and 150c via the first insulating layer 148. Although the dummy electrode pattern 143 is electrically insulated from the first electrode pattern 142 and the second electrode pattern 144, the dummy electrode pattern 143 similarly has a mesh shape and is arranged so that the mesh portion of the mesh overlaps with a pixel 112. By arranging the dummy electrode pattern 143 to fill a gap between the first electrode pattern 142 and the second electrode pattern 144, it is difficult for an electrode of the touch sensor 106 to be seen, deterioration of image quality of the display device 100 is prevented, and it is possible to ensure that the design of the device is not aesthetically lost.

As is shown in FIG. 6, by arranging the first electrode pattern 142, the second electrode pattern 144 and the connection wiring 146 in a mesh shape and arranging the mesh eye part (opening part 154) in alignment with a pixel 112, it is possible to ensure that the pixel 112 is not shielded. The first electrode pattern 142, the second electrode pattern 144 and the connection wiring 146 have a function which is equal to a light shielding film when the mesh pattern surrounds the pixel 112. By adopting this function, it is possible to reduce the ratio of light emitted from a certain pixel leaking to adjacent pixels, and improve image quality.

The width (thickness) of the mesh of the first electrode pattern 142, the second electrode pattern 144 and the connection wiring 146 is set to be the same as or smaller than an interval (distance) between adjacent pixels. Therefore, it is difficult to visually see the first sensor electrode 114 and the second sensor electrode 116 with the naked eye. In addition, it is possible to set the area of the opening part 154 (meshed pattern portion) in the first electrode pattern 142, the second electrode pattern 144 and the connection wiring 146 to be 50% or more of the area of each electrode pattern.

By forming the first electrode pattern 142, the second electrode pattern 144, and the connection wiring 146 with a fine structure in this way, it is possible to prevent forming a mirror-smooth surface even when an electrode pattern is formed by a metal film such as aluminum. Furthermore, as is shown in FIG. 2, since the polarization plate 138 is arranged on the upper surface (viewing side) of the touch sensor 106, the first sensor electrode 114 and the second sensor electrode 116 are prevented from being viewed with the naked eye. According to the structure of the first sensor electrode 114 and the second sensor electrode 116 shown in FIG. 6, it is possible to achieve a reduction in resistance of a sensor electrode and it is possible to prevent a decrease in image quality due to arranging the touch sensor 106 overlapping the display part 104.

Next, the detailed structure of the display device 100a which includes the touch sensor 106 and the antenna 108 is explained based on the cross-sectional structure corresponding to the line C1-C2, the line D1-D2, the line E1-E2 and the line F1-F2 shown in FIG. 4. In addition, the cross-sectional structure of a pixel is also explained in order to understand the cross-sectional structure.

Figure 7:
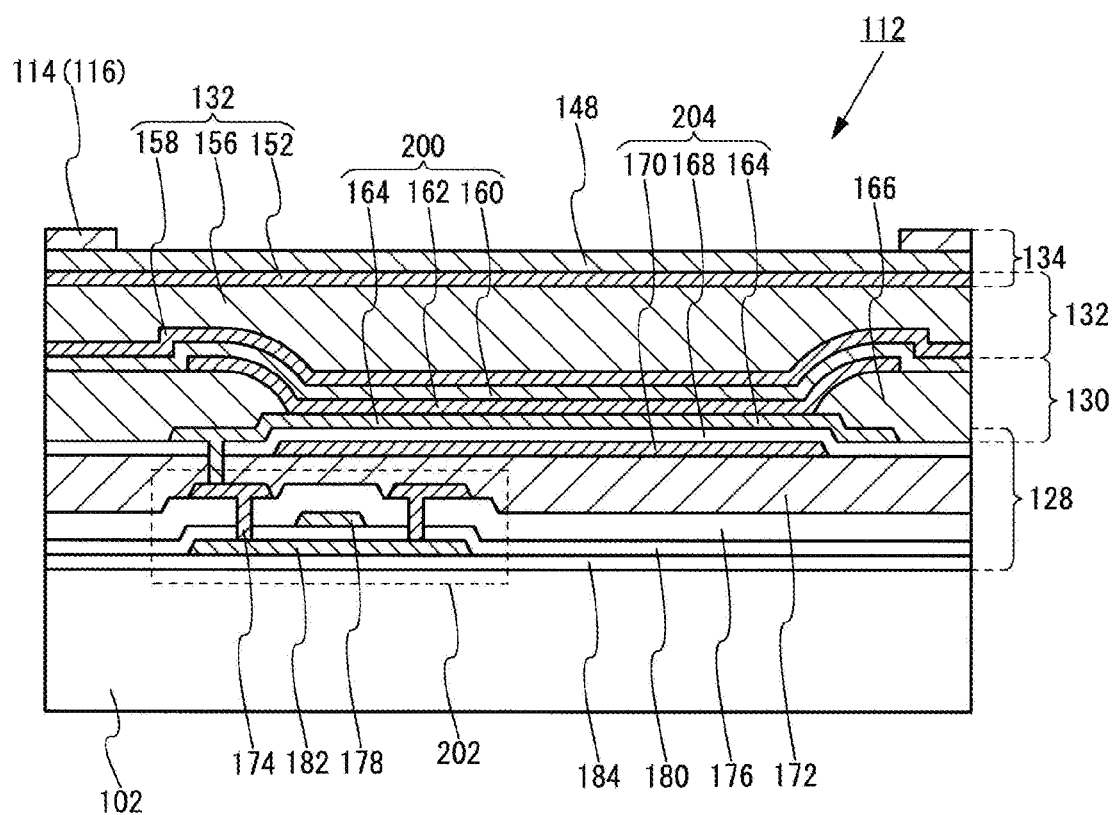
FIG. 7 is a cross-sectional diagram showing a structure of a pixel in a display device related to one embodiment of the present invention.

FIG. 7 shows a cross-sectional structure of a pixel 112 in the display device 100a. The pixel 112 has a structure in which the driving element layer 128 and the display element layer 130 are stacked. The sealing layer 132 and a touch sensor layer 134 are arranged above the display element layer 130. The driving element layer 128 includes the transistor 202 and the capacitor element 204 and the display element layer 130 includes the light emitting element 200.

The touch sensor layer 134 has the same structure as the structure shown in FIG. 5B and FIG. 5C. The touch sensor layer 134 includes a first insulating layer 148 and a second insulating layer 152. The first electrode pattern 142 or the second electrode pattern 144 is arranged on the first surface side (upper surface side) of the first insulating layer 148. The first insulating layer 148 is formed by an inorganic insulating film such as a silicon nitride film or a silicon oxide film, or an organic insulating film such as an acrylic resin or a polyimide resin. The second insulating layer 152 also serves as an insulating layer which forms the sealing layer 132 described herein.

In FIG. 7, the sealing layer 132 includes a second insulating layer 152, a third insulating layer 156 and a fourth insulating layer 158. The display element layer 130 includes the light emitting element 200 (first electrode 160, organic layer 162 and second electrode 164) and a fifth insulating layer 166. The driving element layer 128 includes the capacitor element 204 (second electrode 164, sixth insulating layer 168 and the capacitor electrode 170), a seventh insulating layer 172, a source/drain electrode 174, an eighth insulating layer 176, a transistor 202 (gate electrode 178, ninth insulating layer 180 and semiconductor layer 182), and a tenth insulating layer 184. In one example of a pixel shown in FIG. 7, the second electrode 164 serves as both an electrode of the light emitting element 200 and an electrode of the capacitor element 204.

A current (drain current) which flows between the source and the drain of the transistor 202 is controlled by a voltage applied to the gate electrode 178. The light emission intensity of the light emitting element 200 is controlled by the drain current. A gate voltage is applied by connecting the capacitor element 204 between the gate and the source of the transistor 202 and is arranged to maintain a constant gate voltage.

The sealing layer 132 is arranged to cover the first electrode 160 and the fifth insulating layer 166. The sealing layer 132 has a structure in which the second insulating layer 152, the third insulating layer 156 and the fourth insulating layer 158 are stacked. The second insulating layer 152 and the fourth insulating layer 158 are formed from an inorganic insulating film such as a silicon nitride film or an aluminum oxide film. The third insulating layer 156 is formed from an organic resin material such as acrylic resin, polyimide resin, polyamide resin or an epoxy resin and the like.

In the display element layer 130, the first electrode 160 is arranged over a plurality of pixels and the second electrode 164 is arranged for each pixel. The fifth insulating layer 166 is arranged to expose an inner region of the second electrode 164 and cover a periphery part. The fifth insulating layer 166 is formed from an organic resin material in order to form a smooth step at the opening end where the second electrode 164 is exposed. An acrylic resin, a polyimide resin or a polyamide resin and the like is used as the organic resin material. The organic layer 162 is arranged to cover the surface of the fifth insulating layer 166 from the upper surface of the second electrode 164. The first electrode 160 is arranged to cover the upper surface of the organic layer 162 and the fifth insulating layer 166. A region in the light emitting element 200 where the first electrode 160, the organic layer 162 and the second electrode 164 overlap is a light emitting region. Among the pixels 112, the light emitting region is a unit element for displaying an image.

In the present embodiment, a pixel which is explained by referring to FIG. 6 includes the case of indicating a light emitting region of the light emitting element 200. For example, the light emitting region of the light emitting element 200 is, in other words, the light emitting region of the pixel 112, and the opening part 154 of the first electrode pattern 142, the second electrode pattern 144 and the connecting wiring 146 is arranged to surround the light emitting region of the pixel 112.

The organic layer 162 is formed using a low molecular weight or high molecular weight organic electroluminescent material. In the case where a low molecular weight organic electroluminescent material is used, in addition to a light emitting layer containing an organic electroluminescent material, the organic layer 162 is appropriately arranged with a carrier injection layer (hole injection layer, electron injection layer), and a carrier transport layer (hole transport layer, electron transport layer) which sandwich the light emitting layer. For example, the organic layer 162 has a structure in which a light emitting layer is sandwiched between a hole injection layer and an electron injection layer. In addition to the hole injection layer and the electron injection layer, a hole transport layer, an electron transport layer, a hole blocking layer and an electron blocking layer and the like may be appropriately added to the organic layer 162.

In the present embodiment, it is assumed that the light emitting element 200 has a structure in which light emitted from the organic layer 162 is output to the touch sensor layer 134 side. The second electrode 164 is formed including a metal film or a light reflective metal film which reflects the light emitted from the organic layer 162. For example, the second electrode 164 is preferred to be formed including a metal film with high light reflectivity in the visible light band such as aluminum (Al) or silver (Ag) and the like. In addition, the second electrode 164 is formed by stacking a transparent conductive film such as ITO, indium zinc oxide (IZO), zinc oxide added with aluminum (AZO) or zinc oxide added with gallium (GZO) and a metal film. Since the first electrode 160 allows the light emitted from the organic layer 162 to pass through, the first electrode 160 may also be formed of a transparent conductive film such as ITO, IZO, AZO or GZO. In addition, the first electrode 160 may also be formed using a metal material such as a silver-magnesium alloy (AgMg) having a film thickness which allows light to pass through.

The first insulating layer 148 is arranged above the sealing layer 132, and the first sensor electrode 114 or the second sensor electrode 116 is further arranged. In the case where the first electrode pattern 142 and the second electrode pattern 144 are formed from a metal such as aluminum (Al), silver (Ag), titanium (Ti), molybdenum (Mo), nickel (Ni), chromium (Cr) or tantalum or an alloy containing these metals as a main component, they are formed into a mesh shape and are arranged to not overlap the light emitting region of the light emitting element 200.

A capacitor electrode 170 is arranged on the upper surface of the seventh insulating layer 172 in the driving element layer 128. The sixth insulating layer 168 is arranged on the upper surface of the capacitor electrode 170. The second electrode 164 is arranged on the sixth insulating layer 168. The second electrode 164 is electrically connected to the source/drain electrode 174 via a contact hole which passes through the sixth insulating layer 168 and the seventh insulating layer 172. The second electrode 164 and the capacitor electrode 170 are formed including a region which overlaps and sandwiches the sixth insulating layer 168. The sixth insulating layer 168 is formed from an inorganic insulating material such as silicon nitride, silicon oxide or silicon oxynitride and the like.

In the transistor 202 has a structure in which a semiconductor layer 182 which is arranged over the tenth insulating layer 184, the ninth insulating layer 180 which is used as a gate insulating film, and a gate electrode 178 are stacked in the driving element layer 128. The semiconductor layer 182 is formed from a semiconductor material such as amorphous silicon or polycrystalline silicon or metal oxide. The semiconductor layer 182 is insulated from the gate electrode 178 by the ninth insulating layer 180. The eighth insulating layer 176 is arranged above the gate electrode 178. The source/drain electrode 174 is arranged above the eighth insulating layer 176. The source/drain electrode 174 is electrically connected to the semiconductor layer 182 via a contact hole formed in the eighth insulating layer 176. The ninth insulating layer 180 and the tenth insulating layer 184 are formed from an inorganic insulating film such as silicon oxide, silicon nitride or silicon oxynitride and the like. In addition, the gate electrode 178 and the source/drain electrode 174 are formed using a metal material such as aluminum, molybdenum, titanium or tungsten and the like. The seventh insulating layer 172 is arranged above the source/drain electrode 174. The seventh insulating layer 172 buries the transistor 202 and is used as a planarization film for flattening a surface. The seventh insulating layer 172 is manufactured from an organic insulating material such as polyimide or acrylic.

Figure 8:
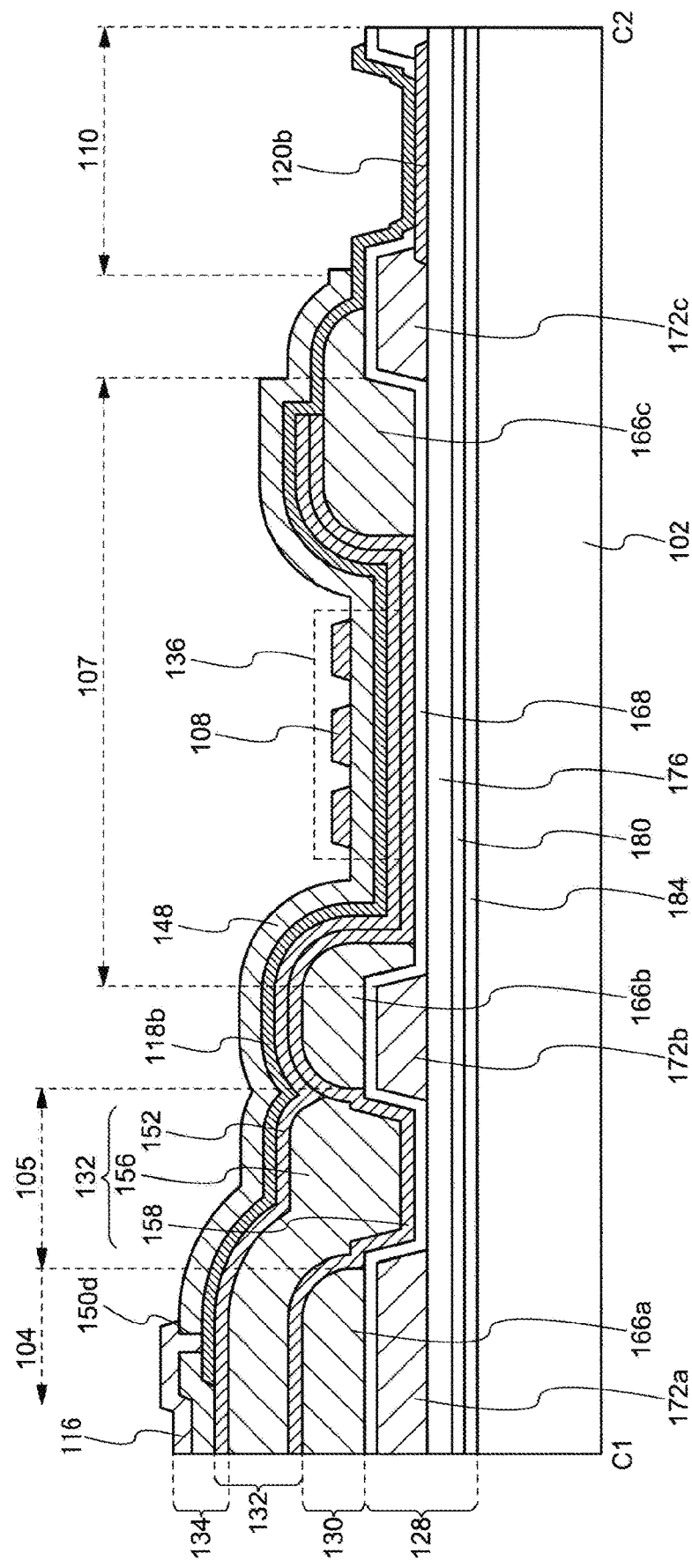
FIG. 8 is a diagram showing a cross-sectional structure corresponding to the line C1-C2 shown in FIG. 4.

FIG. 8 shows a cross-sectional structure corresponding to the line C1-C2 shown in FIG. 4. FIG. 8 shows a structure in which the touch sensor layer 134, the display element layer 130 and the driving element layer 128 are stacked on the base member 102. In addition, FIG. 8 shows a form in which the first opening part 105 and the second opening part 107 are arranged between the display part 104 and the terminal part 110.

The terminal part 110 includes a second terminal electrode 120b which is arranged above the eighth insulating layer 176. The second terminal electrode 120b is exposed from opening parts arranged in the seventh insulating layer 172 and the sixth insulating layer 168. The display part 104 has a structure in which the touch sensor layer 134, the display element layer 130 and the driving element layer 128 are stacked. The first opening part 105 is arranged with a through groove in the fifth insulating layer 166 and the seventh insulating layer 172. The second opening part 107 is also arranged with a through groove in the fifth insulating layer 166 and the seventh insulating layer 172. The through grooves of the first opening part 105 and the second opening part 107 are arranged to surround the periphery of the display part 104.

By arranging a through groove in the fifth insulating layer 166 and the seventh insulating layer 172 in the first opening part 105, the upper surface of the eighth insulating layer 176 arrange on the lower layer side is exposed. The sixth insulating layer 168 is arranged to cover the side surface of the seventh insulating layer 172 and to contact the upper surface of the eighth insulating layer 176. The sealing layer 132 is arranged to bury the first opening part 105. Specifically, the fourth insulating layer 158 is arranged along the surfaces of the fifth insulating layers 166a and 166b and the upper surface of the sixth insulating layer 168. Although the third insulating layer 156 is arranged to bury the first opening part 105 (through grooves of the fifth insulating layer 166 and seventh insulating layer 172), the third insulating layer 156 is arranged to not protrude to the outer side (terminal part 110 side) of the fifth insulating layer 166b. The second insulating layer 152 is arranged on the upper surface of the third insulating layer 156 and contacts the fourth insulating layer 158 at an upper part of the fifth insulating layer 166b.

The first opening part 105 has a structure in which the fifth insulating layer 166 which is formed from an organic resin film is covered by the fourth insulating layer 158 formed from an inorganic insulating film, and the seventh insulating layer 172 which is formed from an organic resin film is covered by the sixth insulating layer 168 formed from an inorganic insulating film. In addition, the first opening part 105 has a structure in which the fourth insulating layer 158, the sixth insulating layer 168, the eighth insulating layer 176, the ninth insulating layer 180 and the tenth insulating layer 184 which are formed from an inorganic insulating film are stacked. By adopting such a structure, a structure is formed in which a region in which the fifth insulating layer 166 and the seventh insulating layer 172 which are formed from an organic resin film are divided is formed between the display part 104 and the terminal part 110, and this divided region Is covered by an inorganic insulating film. That is, it is possible to prevent moisture in the atmosphere from entering the display part 104 through an organic resin film.

The second opening part 107 is arranged so that the sixth insulating layer 168 covers the seventh insulating layers 172b and 172c and contacts the eighth insulating layer 176. Furthermore, a through groove is arranged in the fifth insulating layer 166 to overlap the through groove of the seventh insulating layer 172. The fourth insulating layer 158 covers the fifth insulating layers 166b and 166c and is arranged to contact the sixth insulating layer 168. In the second opening part 107, the third insulating layer 156 is not arranged in the sealing layer 132, and the second insulating layer 152 and the fourth insulating layer 158 are arranged in contact with each other. The second insulating layer 152 and the fourth insulating layer 158 are arranged so that an end part is positioned before the terminal part 110, that is, on an upper part of the fifth insulating layer 166c.

The second wiring 118b is arranged between the first insulating layer 148 and the second insulating layer 152. The second wiring 118b is electrically connected to the second sensor electrode 116 by a contact hole 150d arranged in the first insulating layer 148. The second wiring 118b extends to the terminal part 110 along the upper surface of the second insulating layer 152. The second wiring 118b is electrically connected to the second terminal electrode 120b at the terminal part 110. The second wiring 118b is arranged with the first insulating layer 148. In the second opening part 107, the antenna 108 is arranged above the first insulating layer 148. By arranging the second wiring 118b on the lower surface side of the first insulating layer 148, short circuiting with the antenna 108 is prevented.

As is shown in FIG. 8, the first insulating layer 148 is arranged to include a region where the second surface side (lower surface side) contacts the second insulating layer 152 which forms the sealing layer 132. In this way, the second sensor electrode 116 and the antenna 108 can be arranged on the same layer and the second wiring 118b can be arranged in a different layer. It is possible to arrange the antenna 108 having a part which intersects with the second wiring 118b on the outer side of the second sensor electrode 116. According to the present embodiment, the touch sensor 106 and the antenna 108 can be built into the display device 100a just by adding one insulating layer on the sealing layer 132.

Figure 9:
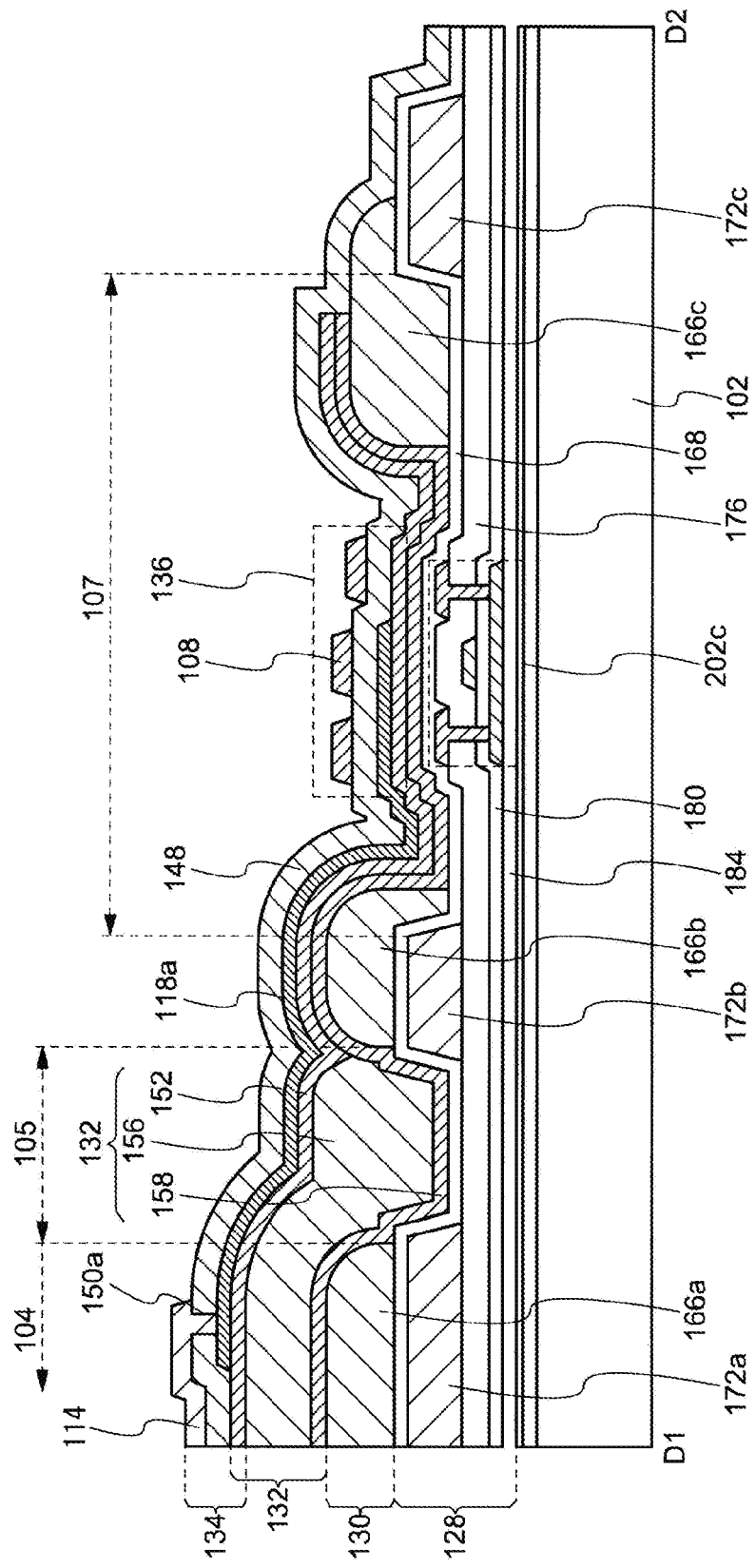
FIG. 9 is a diagram showing a cross-sectional structure corresponding to the line D1-D2 shown in FIG. 4.

FIG. 9 shows a cross-sectional structure corresponding to the line D1-D2 shown in FIG. 4. FIG. 9 shows a structure in which the touch sensor layer 134, the display element layer 130 and the driving element layer 128 are stacked on the base member 102. In addition, FIG. 9 shows a form in which the first opening part 105 and the second opening part 107 are arranged between the display part 104 and an end part of the base member 102. Furthermore, FIG. 9 schematically shows the transistor 202c which forms the scanning signal line driving circuit 111b. The first opening part 105 and the second opening part 107 have the same structure as explained while referring to FIG. 8.

In FIG. 9, the first wiring 118a is arranged between the first insulating layer 148 and the second insulating layer 152. The first wiring 118a is electrically connected to the first sensor electrode 114 via a contact hole 150a which is arranged in the first insulating layer 148. The first wiring 118a extends to the second opening part 107. A part of the antenna 108 which is arranged on the upper surface of the first insulating layer 148 has a region which overlaps the first wiring 118a via the first insulating layer 148 in the second opening part 107. In addition, a part of the antenna 108 has a region which overlaps the transistor 202c which forms the scanning signal line driving circuit 111b via the first insulating layer 148, the second insulating layer 152, the fourth insulating layer 158 and the sixth insulating layer 168.

Figure 10:
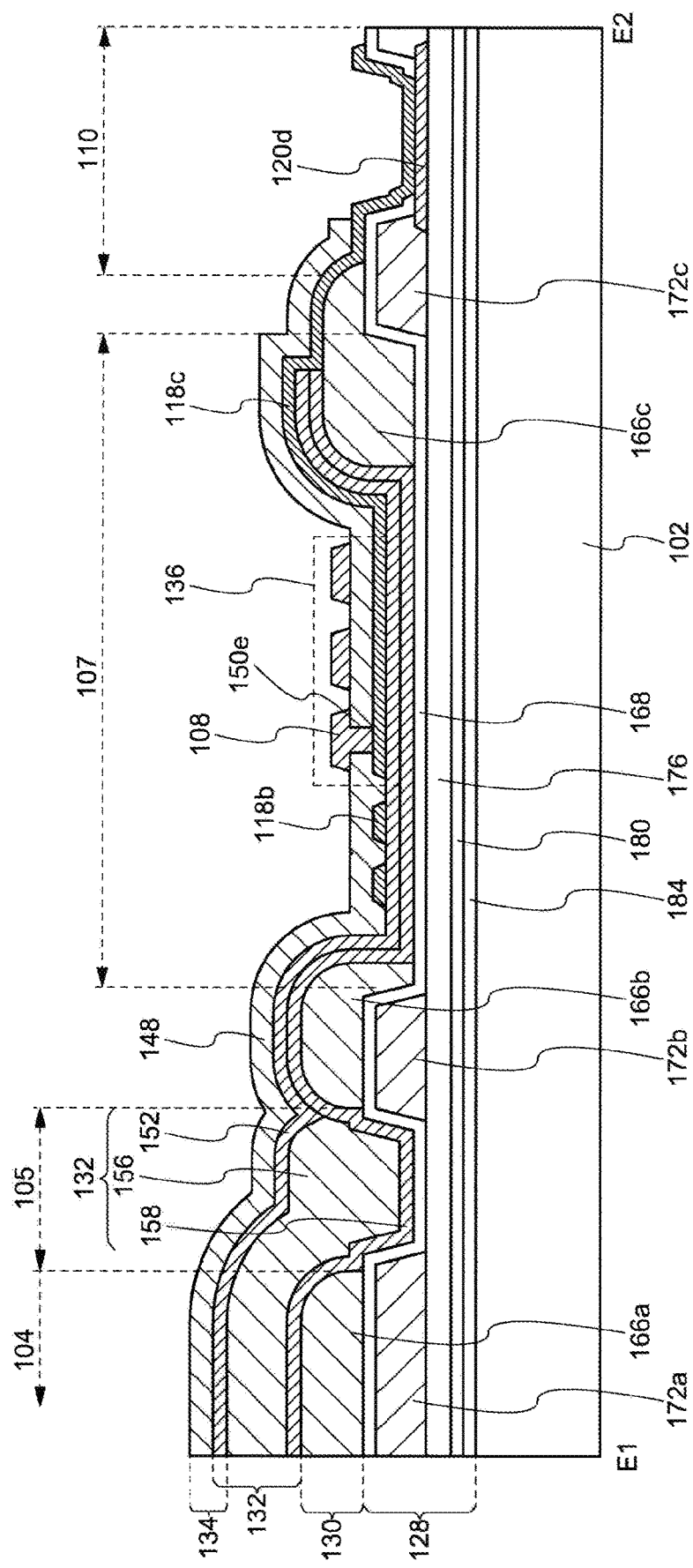
FIG. 10 is a diagram showing a cross-sectional structure corresponding to the line E1-E2 shown in FIG. 4.

FIG. 10 shows a cross-sectional structure corresponding to the line E1-E2 shown in FIG. 4. FIG. 10 shows a structure in which the touch sensor layer 134, the display element layer 130 and the driving element layer 128 are stacked on the base member 102. FIG. 10 shows a form in which the first opening part 105 and the second opening part 107 are arranged between the display part 104 and an end part of the base member 102. The first opening part 105 and the second opening part 107 have the same structure as explained while referring to FIG. 8.

FIG. 10 shows a connection structure between the antenna 108 and the terminal part 110. The antenna 108 is arranged on the upper surface of the first insulating layer 148. The antenna 108 is arranged in a region which overlaps the second opening part 107 in the region between the display part 104 and the terminal part 110. As is shown in FIG. 4, the first end of the antenna 108 is electrically connected to the third terminal electrode 120c, and the second end is electrically connected to the fourth terminal electrode 120d by the third wiring 118c. As is shown in FIG. 10, the third wiring 118c is arranged on the lower layer side of the first insulating layer 148. The third wiring 118c is electrically connected to the second end of the antenna 108 via the contact hole 150e which is arranged in the first insulating layer 148. The third wiring 118c extends from the second end of the antenna 108 to the terminal part 110 and is electrically connected to the fourth terminal electrode 120d.

Since the antenna 108 exemplified in the present embodiment is a multi-loop antenna, the second end is located on the inner side of the loop antenna which is multiply wound. Since the third wiring 118c is arranged on the lower layer side of the first insulating layer 148, even if the third wiring 118c is arranged to intersect the multi-loop antenna, a short circuit with the antenna 108 is prevented. In addition, they are arranged at positions which do not interfere with the other wirings 118 (the first wiring 118a, the second wiring 118b) which are arranged in the same layer. That is, since it is possible to arrange the third wiring 118c in the same layer as the wiring (the first wiring 118a, the second wiring 118b) which electrically connects a sensor electrode and a terminal electrode, it is possible to simplify the wiring structure of the display device 100a.

Figure 11:
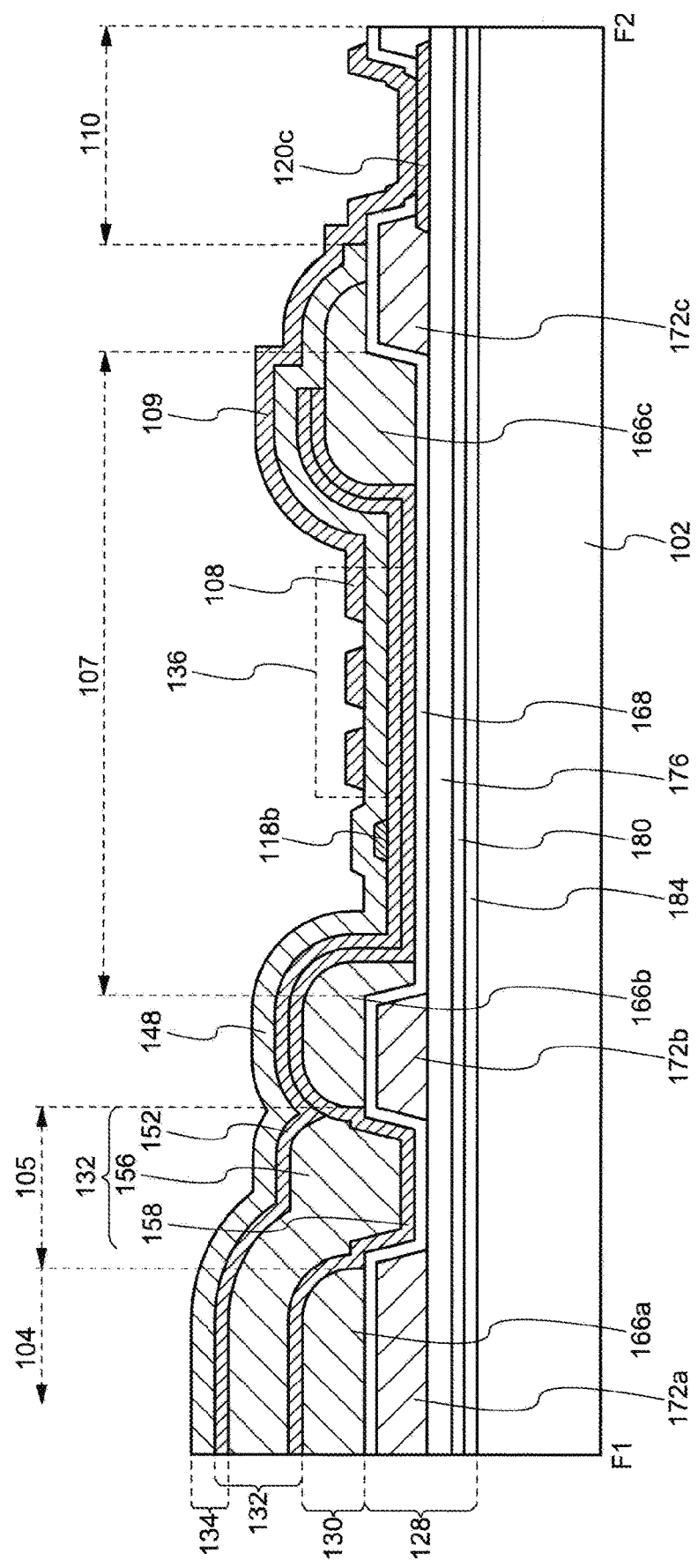
FIG. 11 is a diagram showing a cross-sectional structure corresponding to the line F1-F2 shown in FIG. 4.

FIG. 11 shows a cross-sectional structure corresponding to the line F1-F2 shown in FIG. 4. FIG. 11 shows a structure in which the touch sensor layer 134, the display element layer 130 and the driving element layer 128 are stacked on the base member 102. In addition, FIG. 11 shows a form in which the first opening part 105 and the second opening part 107 are arranged between the display part 104 and an end part of the base member 102. The first opening part 105 and the second opening part 107 have the same structure as explained while referring to FIG. 8.

FIG. 11 shows a connection structure between the antenna 108 and the terminal part 110. The antenna 108 is arranged on the upper surface of the first insulating layer 148 in the second opening part 107. The first end of the antenna 108 is electrically connected to the third terminal electrode 120c. The wiring 109 which is formed in the same layer as the antenna 108 extends to the terminal part 110 and is electrically connected to the third terminal electrode 120c. As is shown in FIG. 11, by forming the wiring 109 which connects the first end of the antenna 108 and the third terminal electrode 120c in the same layer as the conductive layer which forms the antenna 108, it is possible to simplify the structure. In addition, it is possible to simplify the manufacturing process and reduce the number of processes.

According to the present embodiment, by integrating the display device 100a and the antenna 108, it is possible to reduce members of a mobile information terminal device compatible with NFC. In addition, it is possible to reduce the size and thickness of the mobile information terminal device.

Although a display device in which a light emitting element (organic electroluminescence element) is arranged as a display element in a pixel is exemplified in the present embodiment, it is possible to also apply the structure of the touch sensor 108 and the antenna 108 to a liquid crystal display device. In this way, it is possible to provide a liquid crystal display device added with an NFC function.

Second Embodiment

Figure 12:
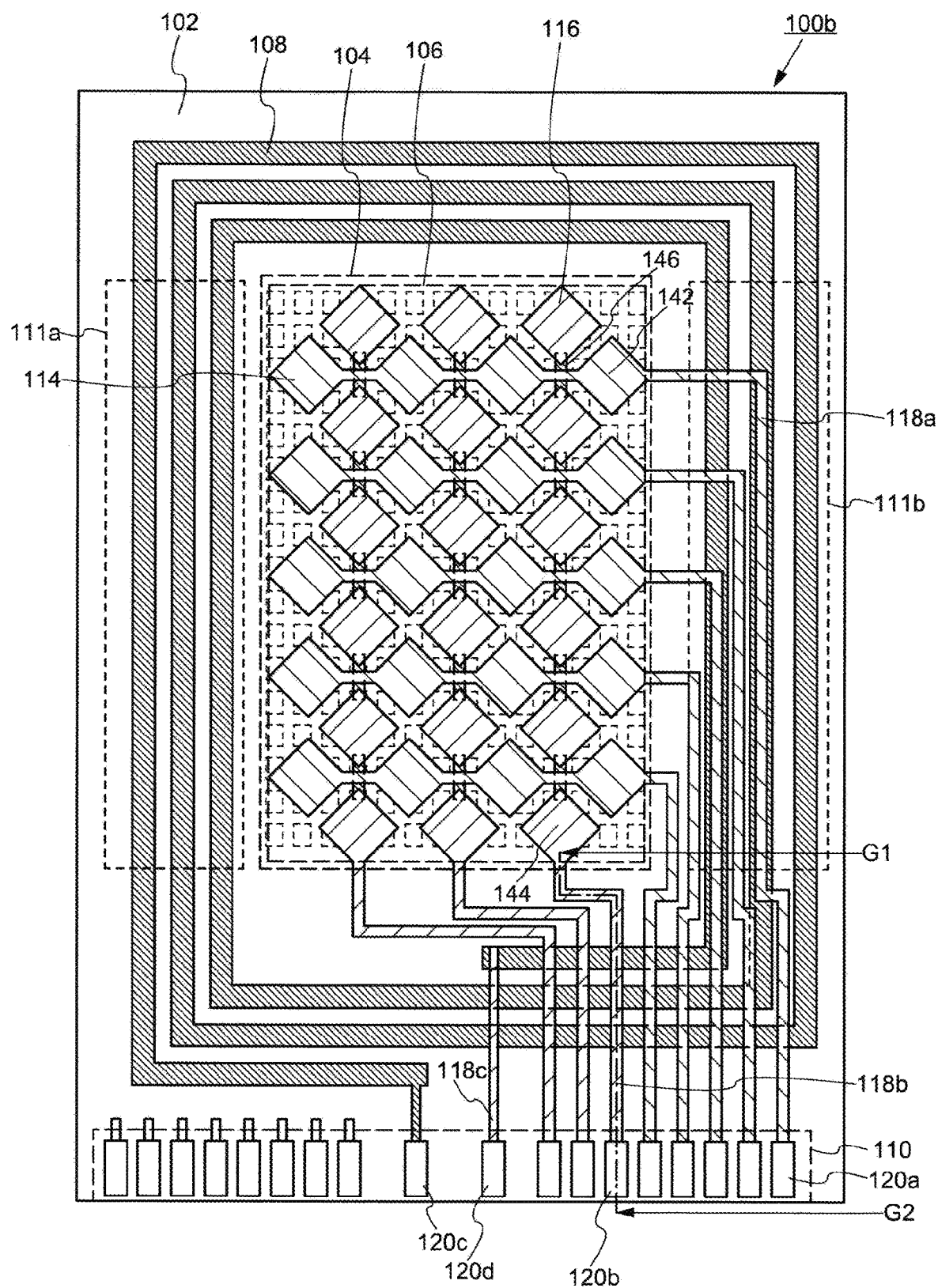
FIG. 12 is a diagram showing a structure of a display device related to one embodiment of the present invention.

FIG. 12 shows a structure of the touch sensor 106 and the antenna 108 of a display device 100b according to the present embodiment. The display device 100b is different from the first embodiment in that the antenna 108 is arranged in the same layer as the connection wiring 146. In addition, the present embodiment is different in that the first sensor electrode 114 and the first terminal electrode 120a are electrically connected by the first wiring 118a which is formed in the same layer as the first electrode pattern 142, the second sensor electrode 116 and the second terminal electrode 120b are connected by the second wiring 118b which is formed in the same layer as the second electrode pattern 144, and the second end of the antenna 108 is connected by the third wiring 118c which is formed in the same layer as the connection wiring 146. In the explanation below, parts which are different from the first embodiment are explained.

Figure 13:
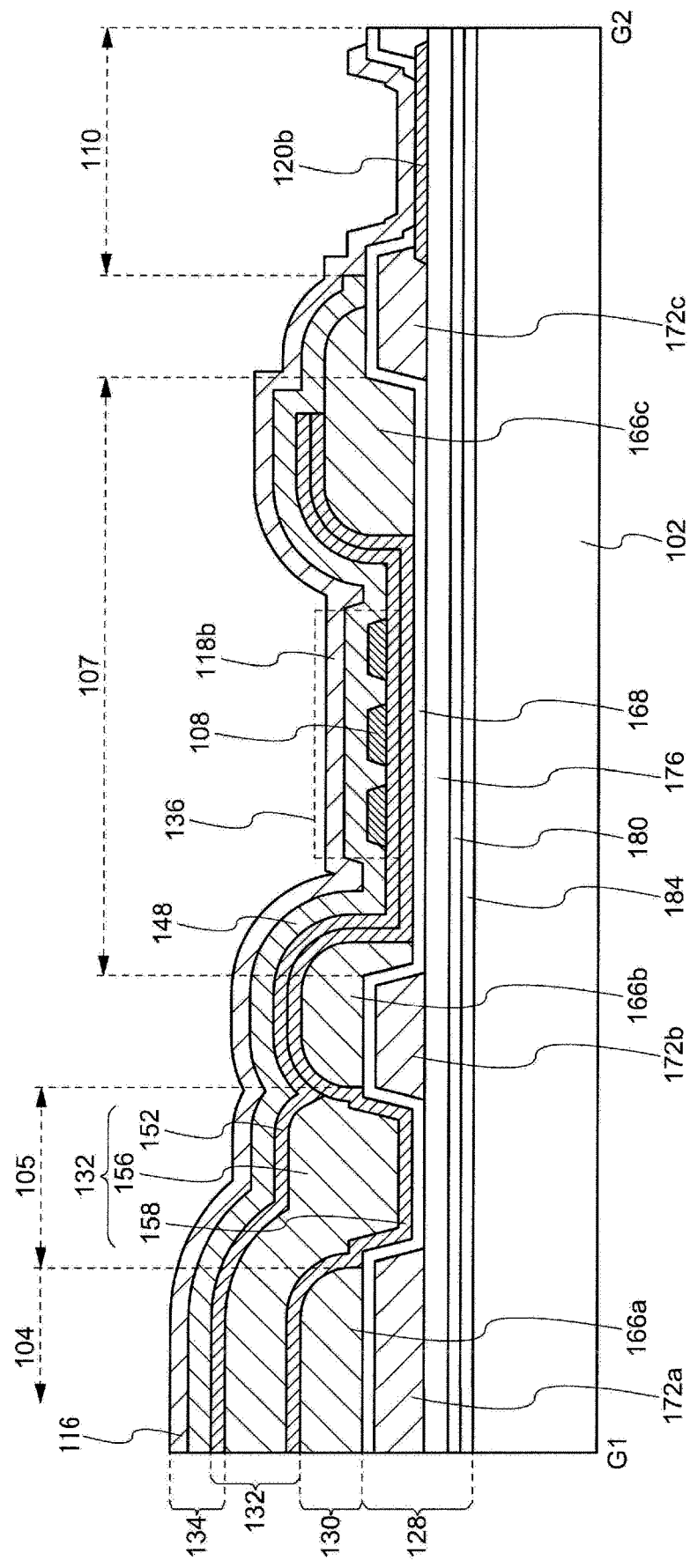
FIG. 13 is a diagram showing a cross-sectional structure corresponding to the line G1-G2 shown in FIG. 12.

In FIG. 12, a cross-sectional structure corresponding to the line G1-G2 is shown in FIG. 13. FIG. 13 shows a connection structure between the second sensor electrode 116 and the second terminal electrode 120b. In FIG. 13, the antenna 108 is arranged between the first insulating layer 148 and the second insulating layer 152. The second wiring 118b which is continuous from the second sensor electrode 116 (second electrode pattern 144) is arranged on the upper layer side of the first insulating layer 148. The second wiring 118b extends above the first insulating layer 148 and is electrically connected to the second terminal electrode 120b.

In the display device 100b, the antenna 108 is arranged on the lower layer side than the touch sensor 106. As is shown in FIG. 13, by arranging the second wiring 118b on the upper layer side of the first insulating layer 148, it is possible to arrange the second wiring 118b to intersect the antenna 108 which is arranged on the lower layer side of the first insulating layer 148. Since the region which intersects the first wiring 118a and the second wiring 118b is a part of the antenna 108, influence on the operation of the antenna is reduced. That is, it is possible to prevent a drop in sensitivity of the antenna 108.

According to the present embodiment, it is possible to provide the display device 100b in which the antenna 108 is arranged on a lower layer side than the touch sensor 106. In this way, it is possible to reduce the members of the mobile information terminal device which is compatible with NFC. In addition, it is possible to reduce the size and thickness of the mobile information terminal device.

Third Embodiment

Figure 14:
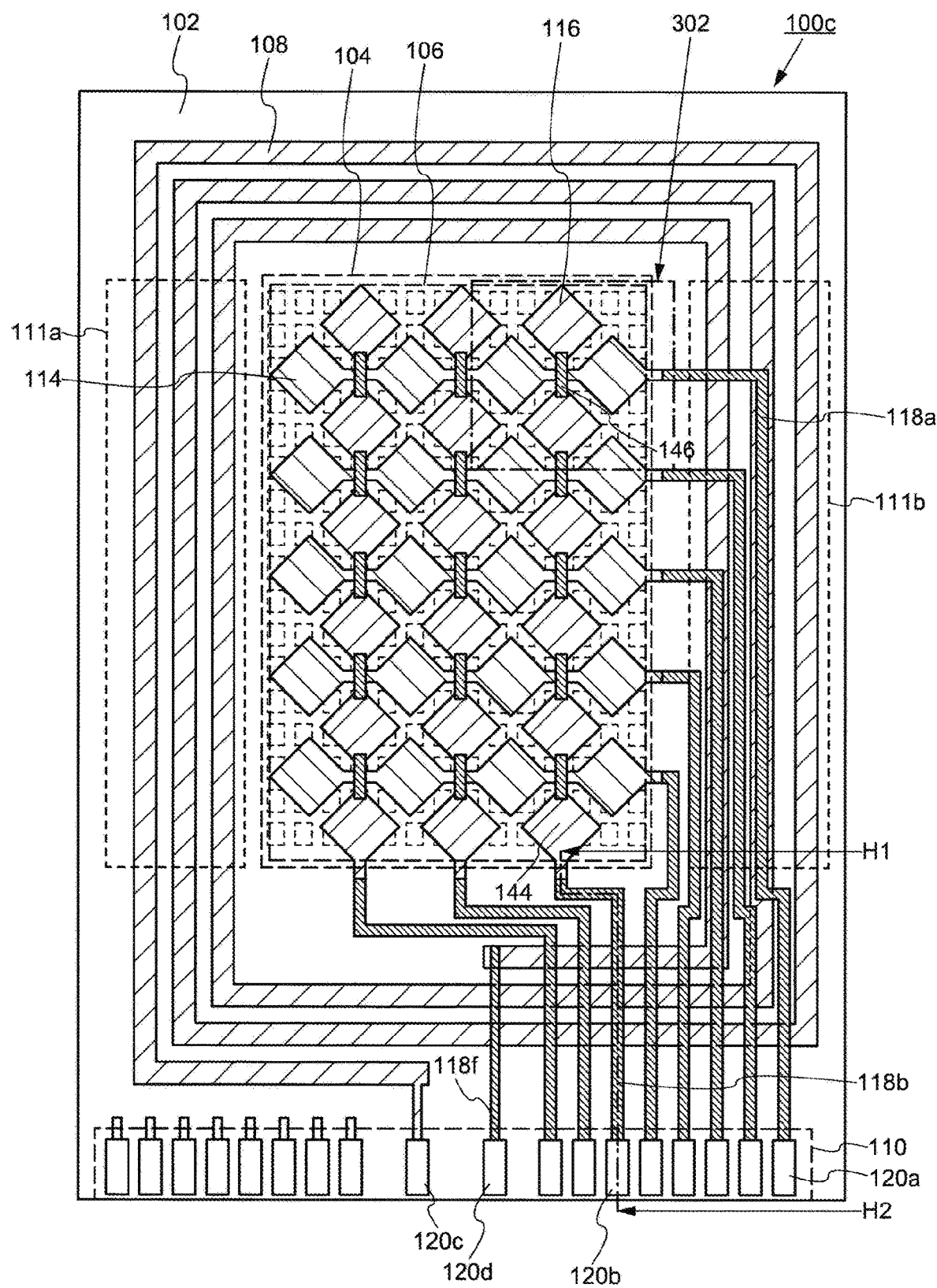
FIG. 14 is a diagram showing a structure of a display device related to one embodiment of the present invention.

FIG. 14 shows a structure of the touch sensor 106 and the antenna 108 of a display device 100c according to the present embodiment. The display device 100c differs from the first embodiment in that the connection wiring 146, the first wiring 118a, the second wiring 118b and the third wiring 118c are arranged on an upper layer side than the touch sensor 106 and the antenna 108. In the explanation below, parts which are different from the first embodiment are explained.

Figure 15A:
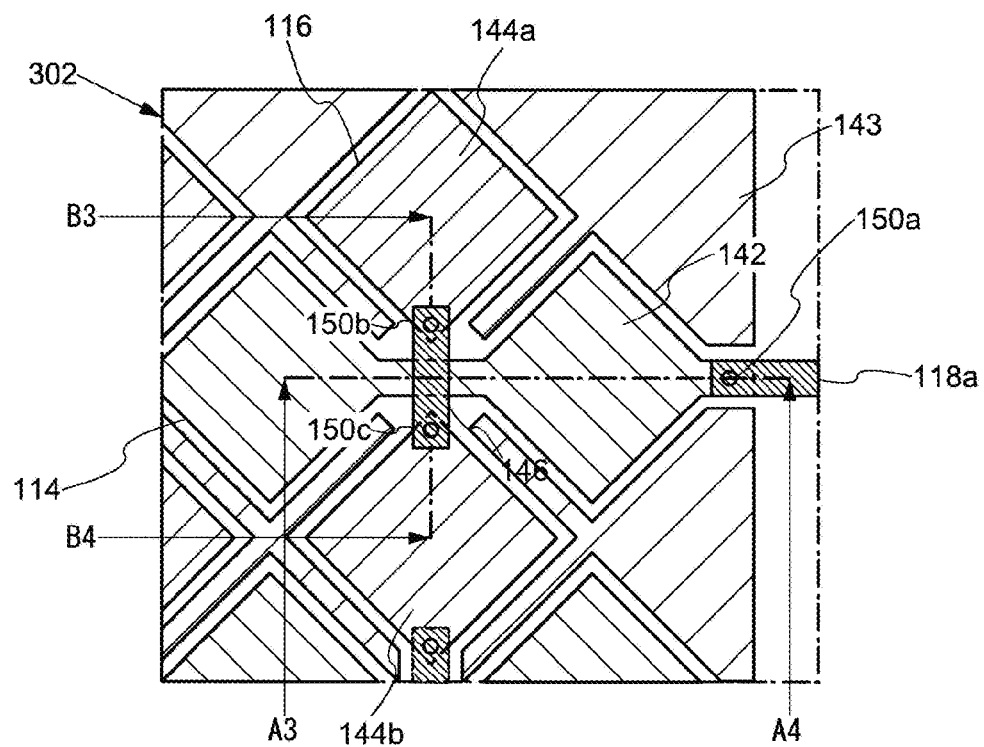
FIG. 15A shows an expanded diagram of a region 302 shown in FIG. 14.
Figure 15B:
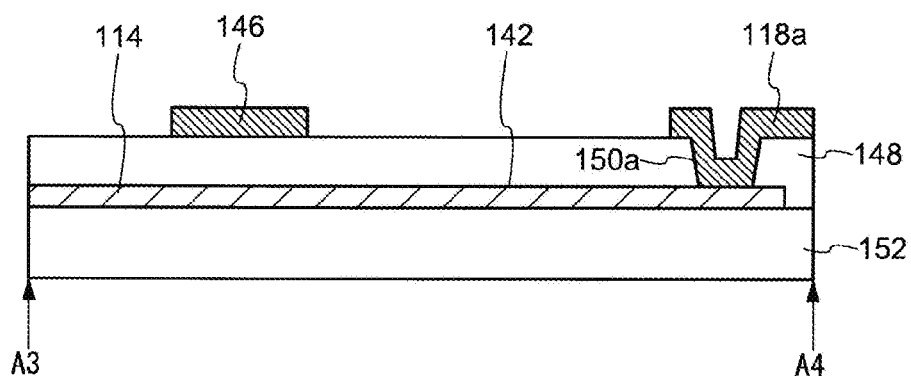
FIG. 15B shows a cross-sectional structure along the line A3-A4 shown in FIG. 15A.
Figure 15C:
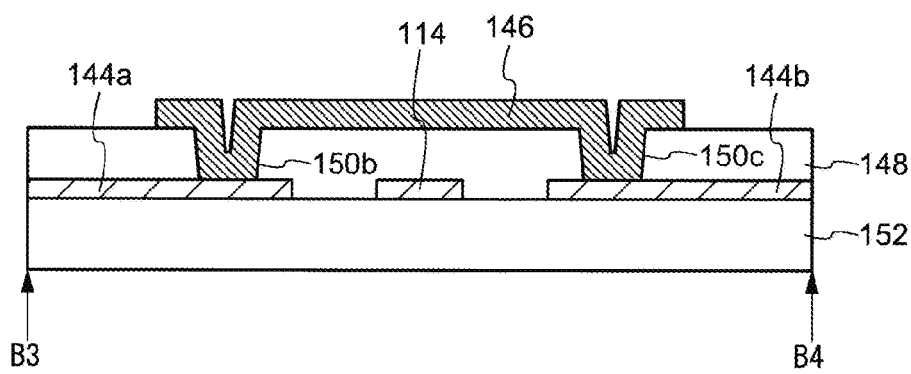
FIG. 15C shows a cross-sectional structure along the line B3-B4 shown in FIG. 15A.

Details of the region 302 shown in FIG. 14 are explained while referring to FIG. 15A, FIG. 15B, and FIG. 15C. FIG. 15A is a planar diagram of the first sensor electrode 114 and the second sensor electrode 116. FIG. 15B shows a cross-sectional structure corresponding to the line A3-A4 shown in FIG. 15A. In addition, FIG. 15C shows a cross-sectional structure corresponding to the line B3-B4 shown in FIG. 15A.

As is shown in FIG. 15A, the first sensor electrode 114 includes a plurality of first electrode patterns 142. Each of the plurality of first electrode patterns 142 is electrically connected to an adjacent one by a conductive layer in the same layer as the first electrode pattern 142. As is shown in FIG. 15B, the first sensor electrode 114 is formed by linking a plurality of first electrode patterns 142 which are arranged on the second surface side (lower surface side) of the first insulating layer 148. The connection wiring 146 is arranged on the first surface side (upper surface side) of the first insulating layer 148. The first wiring 118a is arranged on the first surface side (upper surface side) of the first insulating layer 148. One end of the first sensor electrode 114 is electrically connected to the first wiring 118a via a contact hole 150a which is arranged in the first insulating layer 148.

As is shown in FIG. 15A, the second sensor electrode 116 is formed by electrically connecting the second electrode pattern 144a and the second electrode pattern 144b by the connection wiring 146. As is shown in FIG. 15C, the connection wiring 146 is arranged on the first surface side (upper surface side) of the first insulating layer 148. The second electrode pattern 144a and the second electrode pattern 144b are electrically connected to the connection wiring 146 by the contact hole 150b and the contact hole 150c which are arranged in the first insulating layer 148.

By arranging the first electrode pattern 142 and the second electrode pattern 144 on the second surface side (lower surface side) of the first insulating layer 148, and arranging the connection wiring 146 on the first surface side (upper surface side) of the first insulating layer 148, It is possible to arrange the first sensor electrode 114 and the second sensor electrode 116 to intersect each other. In this case, by forming the connection wiring 146 and the first wiring 118a from a conductive film which is formed in the same layer, it is possible to simplify the structure of the touch sensor 106.

Figure 16:
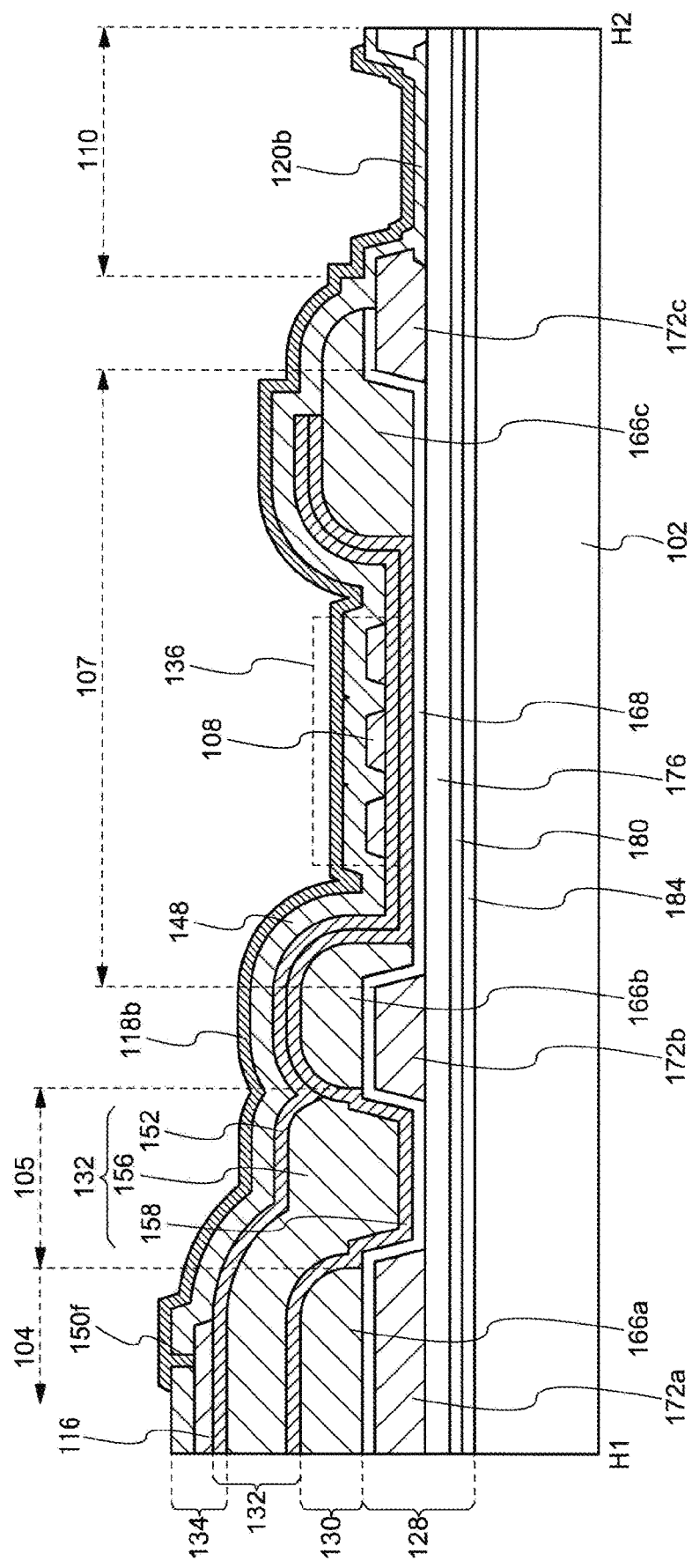
FIG. 16 is a diagram showing a cross-sectional structure corresponding to the line H1-H2 shown in FIG. 14.

In FIG. 14, a cross-sectional structure corresponding to the line H1-H2 is shown in FIG. 16. FIG. 16 shows a connection structure of the second sensor electrode 116 and the second terminal electrode 120b. In FIG. 16, the antenna 108 is arranged on the second surface side (lower surface side) of the first insulating layer 148. The second sensor electrode 116 is arranged on the second surface side (lower surface side) of the first insulating layer 148. That is, the antenna 108 and the second sensor electrode 116 are arranged between the first insulating layer 148 and the second insulating layer 152. In other words, the antenna 108 and the second sensor electrode 116 are arranged on the upper surface of the sealing layer 132. Although not shown in FIG. 16, the first sensor electrode 114 is similarly arranged on the upper surface of the sealing layer 132. A region is included where the second insulating layer 152 and the first insulating layer 148 are in contact. By sandwiching the antenna 108 and the second sensor electrode 116 between the second insulating layer 152 and the first insulating layer 148, they are not exposed to the exterior and are protected. Furthermore, the second sensor electrode 116 and the second wiring 118b are electrically connected via a contact hole 150f which is arranged in the first insulating layer 148.

In the second opening part 107, the antenna 108 is arranged on the second surface side (lower surface side) of the first insulating layer 148. The second wiring 118b is arranged on the first surface side (the upper surface side) of the first insulating layer 148 and is arranged to intersect the antenna 108. Since the region which intersects with the second wiring 118b is a part of the antenna 108c, influence on the operation of the antenna is reduced. That is, it is possible to prevent a drop in sensitivity of the antenna 108c.

According to the present embodiment, it is possible to provide the display device 100c in which the antenna 108c is arranged on a lower layer side than the first wiring 118a and the second wiring 118b. In this way, it is possible to reduce the members of a mobile information terminal device compatible with NFC. In addition, it is possible to reduce the size and thickness of the mobile information terminal device.

Fourth Embodiment

Figure 17:
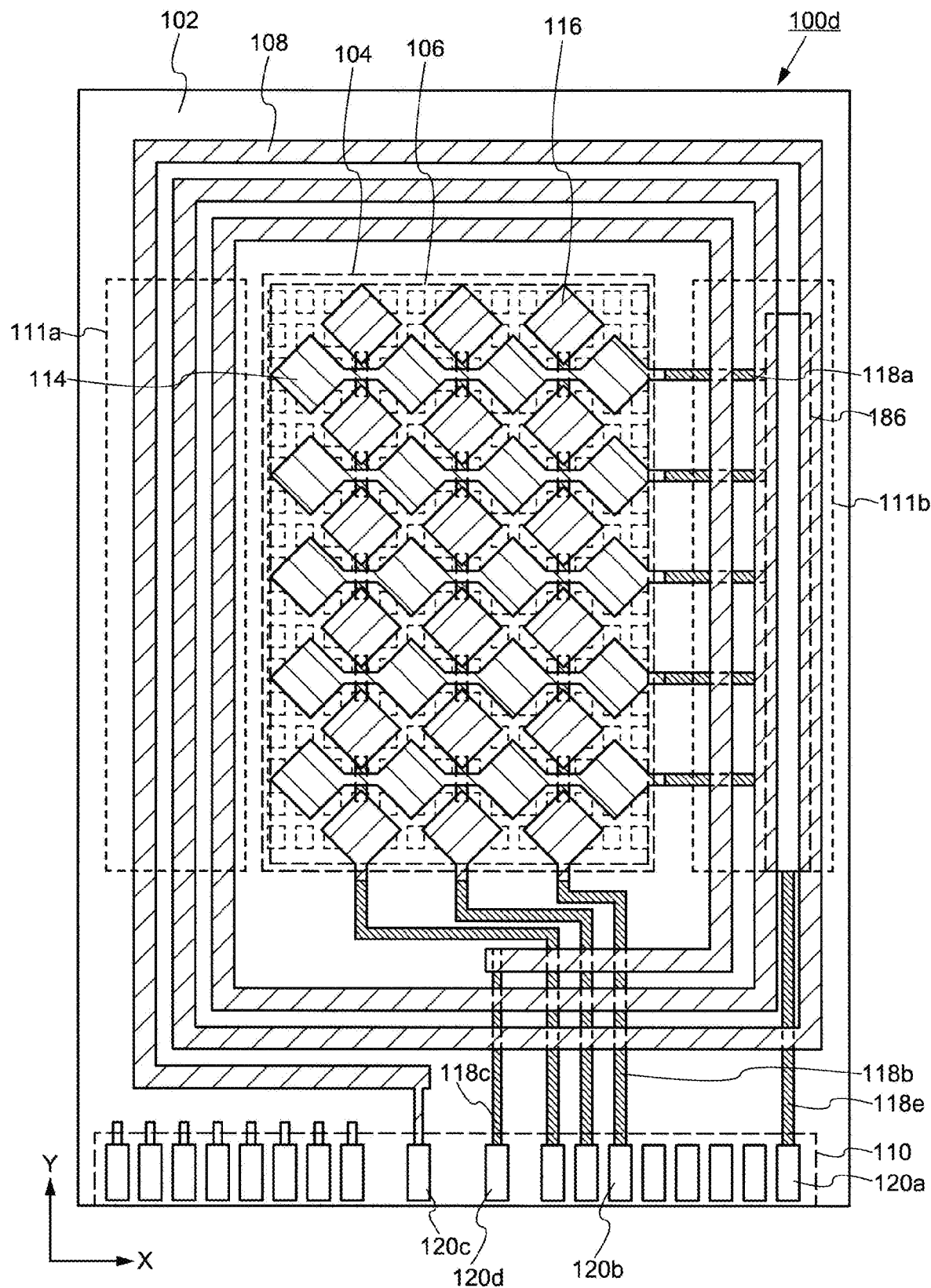
FIG. 17 is a diagram showing a structure of a display device related to one embodiment of the present invention.

FIG. 17 shows a structure of a display device 100d according to the present embodiment. The display device 100d has a structure in which the first sensor electrode 114 is electrically connected to a selection circuit 186 by the first wiring 118a. A plurality of first sensor electrodes 114 are arranged in the touch sensor 106. The selection circuit 186 is formed by a shift register circuit and selects in sequence the plurality of arranged first sensor electrodes 114. The output of the selection circuit 186 is electrically connected to the first terminal electrode 120a by the fourth wiring 118e. Furthermore, in the present embodiment, it is preferred to use the first sensor electrode 114 as a receiver electrode (Rx electrode) and the second sensor electrode 116 as a transmitter electrode (Tx electrode).

It is possible to manufacture the selection circuit above the base member 102 by a transistor having the same layer structure as the transistor which forms the pixel 112. In this way, it is possible to arrange the selection circuit 186 on a lower layer side than the antenna 108. In other words, it is possible to arrange the selection circuit 186 overlapping the antenna 108.

According to the present embodiment, by arranging a selection circuit for selecting a sensor electrode which forms the touch sensor 106, it is possible to reduce the region which arranges the wiring. Specifically, it is possible to reduce the wire length of the first wiring 118a which is electrically connected to the first sensor electrode 114. In this way, it is possible to reduce the area of the wiring routing region (frame region) of the display device 100d. Apart from arranging the selection circuit 186, the structure of the display device 100d is the same as the display device 100a shown in the first embodiment and the same operation and effect are exhibited.

Fifth Embodiment

Figure 18:
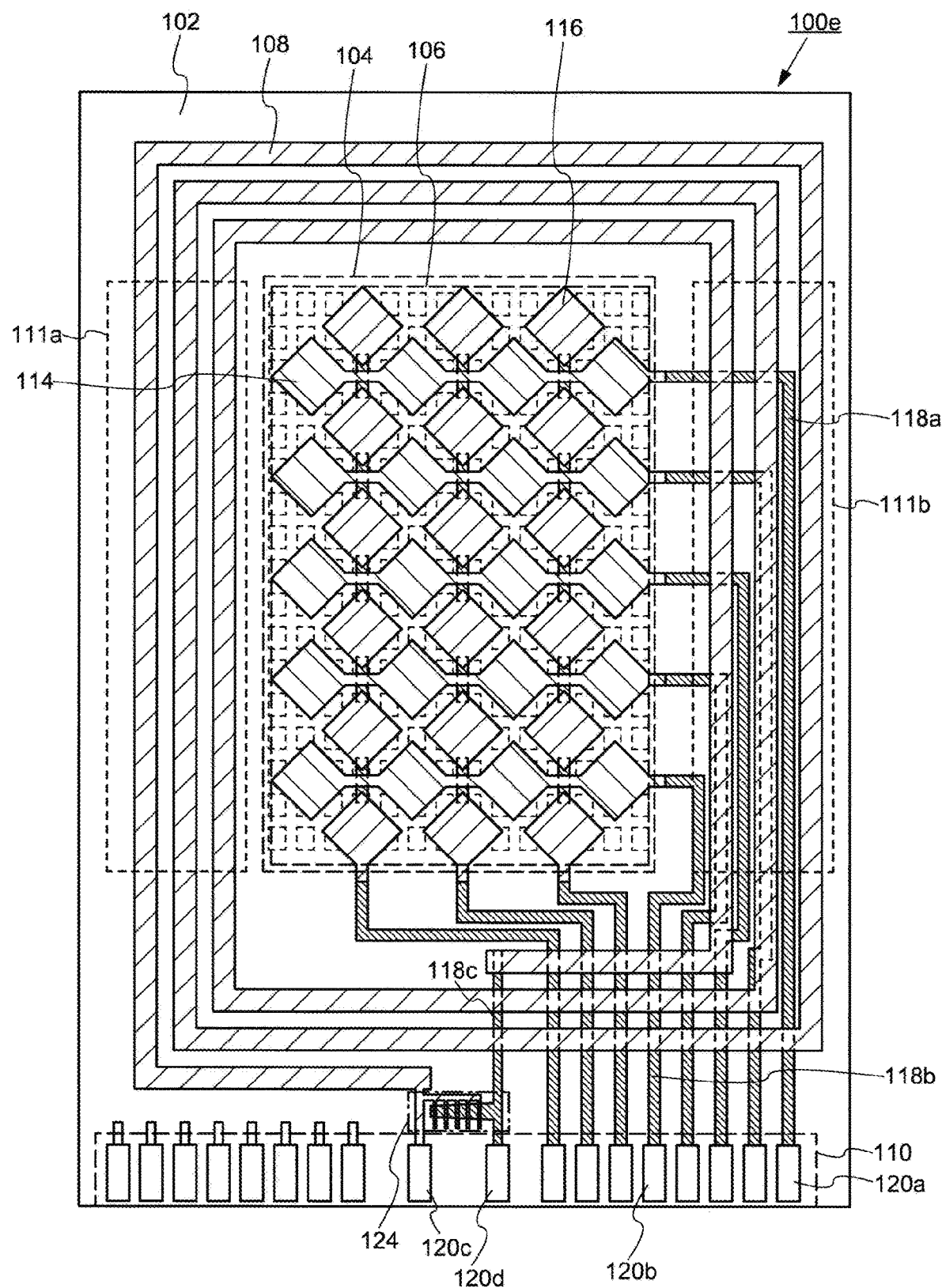
FIG. 18 is a diagram showing a structure of a display device related to one embodiment of the present invention.

FIG. 18 shows a structure of a display device 100e according to the present embodiment. In the display device 100e, a resonance capacitor 124 is arranged between the first end and the second end of the antenna 108. The resonance capacitor 124 is arranged in order to adjust the resonance frequency which is set by an inductance L and a capacitance C of the antenna 108 to match a frequency for performing near field communication (NFC).

Figure 19A:
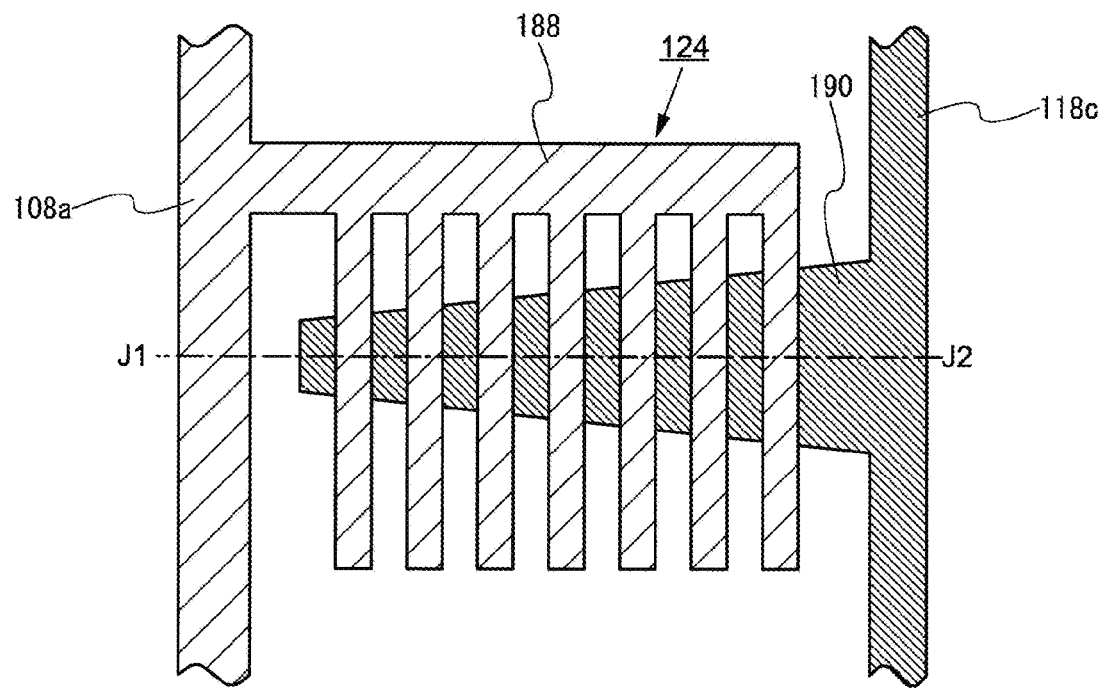
FIG. 19A shows a planar diagram of a resonance capacitor shown in FIG. 18.
Figure 19B:
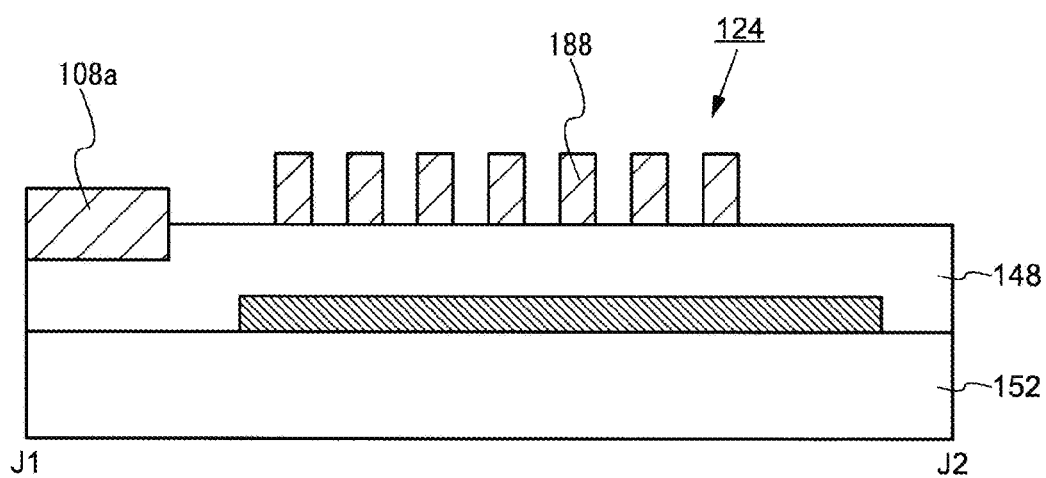
FIG. 19B shows a cross-sectional diagram of a resonance capacitor along the line J1-J2 shown in FIG. 19A.

FIG. 19A shows an enlarged diagram of the resonance capacitor 124. The resonance capacitor 124 is formed by a comb shaped electrode 188 which is connected to the first end side of the antenna 108, and an opposing electrode 190 which is connected to the second end side. FIG. 19B shows a cross-sectional structure along the line J1-J2 shown in FIG. 19A. The first insulating layer 148 is arranged between the comb shaped electrode 188 and the opposing electrode 190, and an electrostatic capacitance is formed between both electrodes.

It is possible to cut the comb shaped electrode 188 which is arranged on the first surface side (upper surface side) of the first insulating layer 148 in order to adjust the electrostatic capacitance of the resonance capacitor 124. By cutting the comb shaped electrode 188 at a predetermined position, it is possible to reduce the electrostatic capacitance of the resonance capacitor 124. In the resonance capacitor 124, by forming the shape of the opposing electrode 190 into a taper shape to gradually become smaller from the tip end side to the base side of the comb shaped electrode 188, it is possible to set the shift amount of a resonance frequency to an almost equal value in the case where the comb shaped electrodes 188 are sequentially cut.

It is possible to form the comb shaped electrode 188 in the same layer as the antenna 108, and the opposing electrode 190 is formed in the same layer as the third wiring 188c. As a result, it is possible to build the resonance capacitor 124 into the display device 100e without adding a new layer. Apart from arranging the resonance capacitor 124, the display device 100e has the same structure as the display device 100a in the first embodiment, and the same operation and effect are exhibited. Furthermore, it is possible to appropriately combine the present embodiment with the display devices according to the second embodiment to the fourth embodiment.

What is claimed is:

1. A display device comprising:
a base member;
a display part with a plurality of pixels above the base member;
a scanning signal line driving circuit arranged above the base member and outside the display part to drive the plurality of pixels;
a touch sensor overlapping the display part;
an antenna in a periphery part of the display part;
a sealing layer covering the display part and extending to the periphery part;
a first insulating layer arranged on the sealing layer;
a first wiring and a second wiring in the periphery part of the display part; and
a terminal part including a plurality of terminal electrodes on an outer side of the antenna,
wherein
the touch sensor includes:
    a first sensor electrode arranged on a first surface side of the first insulating layer and having a plurality of first electrode patterns arranged in a first direction; and
    a second sensor electrode arranged on the first surface side of the first insulating layer and having a plurality of second electrode patterns arranged in a second direction intersecting the first direction,
wherein
the scanning signal line driving circuit is arranged between the base member and the first insulating layer;
a second surface side of the first insulating layer opposite to the first surface side is in contact with the sealing layer;
the plurality of first electrode patterns of the first sensor electrode are electrically connected at the first surface side of the first insulating layer;
the plurality of second electrode patterns of the second sensor electrode are electrically connected by connection wiring arranged on the second surface side of the first insulating layer;
the first wiring and the second wiring are sandwiched between the sealing layer and the first insulating layer, extends to the terminal part, and is connected to at least one of the plurality of terminal electrodes, respectively;
the first sensor electrode is electrically connected to the first wiring;
the second sensor electrode is electrically connected to the second wiring; and
the antenna is arranged on the first surface side of the first insulating layer and surrounding the display part, and at least overlaps a part of the first wiring, a part of the second wiring, and a part of the scanning signal line driving circuit interposed by the first insulating layer.

2. The display device according to claim 1, wherein pairs of adjacent first sensor electrodes are electrically connected by a conducting layer extending from the first electrode pattern within the plurality of first electrode patterns, and pairs of adjacent second sensor electrodes are electrically connected to the connection wiring via a contact hole arranged in the first insulating layer within the plurality of second electrode patterns.

3. The display device according to claim 1, wherein the first sensor electrode is electrically connected to the first wiring via a contact hole arranged in the first insulating layer, and the second sensor electrode is electrically connected to the second wiring via a contact hole arranged in the first insulating layer.

4. The display device according to claim 1, wherein a first end of the antenna extends to the terminal part and is electrically connected to any one of the plurality of terminal electrodes, and a second end of the antenna is electrically connected to any one of the plurality of terminal electrodes by a third wiring arranged on the second surface side of the first insulating layer.

5. The display device according to claim 4, further comprising a resonance capacitor is included between the first end and the second end.

6. The display device according to claim 5, wherein a first electrode of the resonance capacitor has a comb shape, and a second electrode of the resonance capacitor has a plate shape.

7. The display device according to claim 6, wherein the first insulating layer arranged between the first electrode and the second electrode.

8. The display device according to claim 1, wherein the first electrode pattern and the second electrode pattern are non-translucent metals and include a through hole at a position overlapping each of the plurality of pixels respectively.

9. The display device according to claim 1, further comprising a sealing layer,
wherein the sealing layer is included stacked with a second insulating layer, a third insulating layer and a fourth insulating layer from the first insulating layer side.

10. The display device according to claim 9, wherein the first wiring, the second wiring, and the connection wiring are arranged between the first insulating layer and the second insulating layer.

11. The display device according to claim 10, wherein a region is included where the second surface side of the first insulating layer and the second insulating layer are in contact.

12. The display device according to claim 9, wherein the antenna is arranged between the first insulating layer and the second insulating layer.

13. The display device according to claim 1, further comprising a selection circuit arranged along the second direction,
wherein the first wiring is connected to the selection circuit.

14. The display device according to claim 1, wherein the base member has flexibility.

15. A display device comprising:
a base member;
a display part with a plurality of pixels above the base member;
a scanning signal line driving circuit arranged above the base member and outside the display part to drive the plurality of pixels;
a touch sensor overlapping the display part;
an antenna in a periphery part of the display part;
a sealing layer covering the display part and extending to the periphery part;
a first insulating layer arranged on the sealing layer;
a first wiring and a second wiring in a periphery part of the display part; and a terminal part including a plurality of terminal electrodes on an outer side of the antenna,
wherein
the touch sensor includes:
a first sensor electrode arranged on a first surface side of the first insulating layer and having a plurality of first electrode patterns arranged in a first direction; and
a second sensor electrode arranged on the first surface side of the first insulating layer and having a plurality of second electrode patterns arranged in a second direction intersecting the first direction,
wherein
the scanning signal line driving circuit is arranged between the base member and the first insulating layer;
a second surface side of the first insulating layer opposite to the first surface side is in contact with the sealing layer;
the plurality of first electrode patterns of the first sensor electrode are electrically connected at the first surface side of the first insulating layer;
the plurality of second electrode patterns of the second sensor electrode are electrically connected by connection wiring arranged on the second surface side of the first insulating layer;
the first wiring and the second wiring are arranged on the first surface side of the first insulating layer, extends to the terminal part, and is connected to at least one of the plurality of terminal electrodes, respectively;
the first sensor electrode is electrically connected to the first wiring;
the second sensor electrode is electrically connected to the second wiring; and
the antenna is arranged between the sealing layer and the first insulating layer and surrounding the display part and overlaps with a part of the scanning signal line driving circuit, and at least overlaps a part of the first wiring and a part of the second wiring interposed by the first insulating layer.

16. The display device according to claim 15, further comprising a sealing layer,
wherein
the sealing layer is included stacked with a second insulating layer, a third insulating layer and a fourth insulating layer from the first insulating layer side, and
the first sensor electrode, the second sensor electrode and the antenna are arranged between the first insulating layer and the second insulating layer.

17. The display device according to claim 16, wherein a region is included where the second surface side of the first insulating layer and the second insulating layer are in contact.

18. The display device according to claim 15, wherein the base member has flexibility.

19. A display device comprising:
a base member;
a display part with a plurality of pixels;
a scanning signal line driving circuit arranged outside the display part to drive the plurality of pixels;

a touch sensor overlapping the display part and including a first sensor electrode arranged in a first direction and a second sensor electrode arranged in a second direction intersecting the first direction;

an antenna in a periphery part of the display part;

a sealing layer covering the display part and extending to the periphery part;

an insulating layer on the sealing layer;

a terminal part including a first terminal electrode and a second terminal electrode arranged on an outer side of the antenna; and a first wiring electrically connecting the first sensor electrode and the first terminal electrode, and a second wiring electrically connecting the second sensor electrode and the second terminal electrode, wherein the scanning signal line driving circuit is arranged between the base member and the sealing layer;

the first sensor electrode and the second sensor electrode, and the first wiring and the second wiring are arranged interposed by the insulating layer;

the first wiring and the second wiring are arranged between the sealing layer and the insulating layer or on a surface of the insulating layer opposite to the sealing layer side, and extends to the terminal part, the antenna is overlapped with a part of the scanning signal line driving circuit; and the first wiring and the second wiring intersect the antenna via the insulating layer.

20. The display device according to claim 19, wherein the first sensor electrode, the second sensor electrode and the antenna are arranged on the same surface side of the insulating layer.

* * * * *